(12) United States Patent
Cok et al.

(10) Patent No.: US 10,796,971 B2
(45) Date of Patent: Oct. 6, 2020

(54) PRESSURE-ACTIVATED ELECTRICAL INTERCONNECTION WITH ADDITIVE REPAIR

(71) Applicant: X Display Company Technology Limited, Dublin (IE)

(72) Inventors: Ronald S. Cok, Rochester, NY (US); Erich Radauscher, Raleigh, NC (US); Salvatore Bonafede, Chapel Hill, NC (US); Christopher Andrew Bower, Raleigh, NC (US); Matthew Alexander Meitl, Durham, NC (US); Carl Ray Prevatte, Jr., Raleigh, NC (US); Brook Raymond, Cary, NC (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 16/101,735

(22) Filed: Aug. 13, 2018

(65) Prior Publication Data
US 2020/0052152 A1    Feb. 13, 2020

(51) Int. Cl.
*H01L 33/00*    (2010.01)
*H01L 21/66*    (2006.01)
(Continued)

(52) U.S. Cl.
CPC .............. *H01L 22/22* (2013.01); *H01L 22/24* (2013.01); *H01L 25/075* (2013.01);
(Continued)

(58) Field of Classification Search
CPC ..... H01L 33/0095; H01L 22/20; H01L 22/22; H01L 22/24; H01L 22/26; H01L 33/62; H01L 2933/0066
See application file for complete search history.

(56) References Cited

U.S. PATENT DOCUMENTS

| 6,051,878 A | 4/2000 | Akram et al. |
| 6,142,358 A | 11/2000 | Cohn et al. |

(Continued)

FOREIGN PATENT DOCUMENTS

| JP | 2011066130 A | 3/2011 |
| WO | WO-2011/123285 A1 | 10/2011 |

OTHER PUBLICATIONS

Bower, C. A. et al., Transfer Printing: An Approach for Massively Parallel Assembly of Microscale Devices, IEE, Electronic Components and Technology Conference, 2008, pp. 1105-1109.
(Continued)

*Primary Examiner* — Mohammed Shamsuzzaman
*Assistant Examiner* — Aaron J Gray
(74) *Attorney, Agent, or Firm* — William R. Haulbrook; Michael D. Schmitt; Choate, Hall & Stewart LLP

(57) ABSTRACT

A method of making a repaired electrical connection structure comprises providing a substrate having first and second contact pads electrically connected in parallel, providing first and second functionally identical components, disposing a first adhesive layer on the substrate, transferring the first component onto the first adhesive layer, electrically connecting the first component to the first contact pad, testing the first component to determine if the first component is a faulty component and, if the first component is a faulty component, disposing a second adhesive layer on the substrate and transferring the second component onto the second adhesive layer, and electrically connecting the second component to the second contact pad. The first and second adhesive layers can be unpatterned or patterned and the first and second components can be electrically connected to the first and second contact pads, respectively, with connection posts or photolithographically defined electrodes.

22 Claims, 27 Drawing Sheets

(51) Int. Cl.
*H01L 33/62* (2010.01)
*H01L 33/38* (2010.01)
*H01L 25/075* (2006.01)

(52) U.S. Cl.
CPC ............ *H01L 33/387* (2013.01); *H01L 33/62* (2013.01); *H01L 33/0095* (2013.01); *H01L 2933/0066* (2013.01)

(56) References Cited

U.S. PATENT DOCUMENTS

| | | |
|---|---|---|
| 6,448,108 B1 | 9/2002 | Lin |
| 6,969,624 B2 | 11/2005 | Iwafuchi et al. |
| 6,974,711 B2 | 12/2005 | Yanagisawa et al. |
| 7,127,810 B2 | 10/2006 | Kasuga et al. |
| 7,195,733 B2 | 3/2007 | Rogers et al. |
| 7,453,157 B2 | 11/2008 | Haba et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,662,545 B2 | 2/2010 | Nuzzo et al. |
| 7,799,699 B2 | 9/2010 | Nuzzo et al. |
| 7,816,856 B2 | 10/2010 | Cok et al. |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 8,008,182 B2 | 8/2011 | Asakawa |
| 8,039,847 B2 | 10/2011 | Nuzzo et al. |
| 8,198,621 B2 | 6/2012 | Rogers et al. |
| 8,261,660 B2 | 9/2012 | Menard |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,506,867 B2 | 8/2013 | Menard |
| 8,558,243 B2 | 10/2013 | Bibl et al. |
| 8,664,699 B2 | 3/2014 | Nuzzo et al. |
| 8,722,458 B2 | 5/2014 | Rogers et al. |
| 8,754,396 B2 | 6/2014 | Rogers et al. |
| 8,791,474 B1 | 7/2014 | Bibl et al. |
| 8,794,501 B2 | 8/2014 | Bibl et al. |
| 8,803,857 B2 | 8/2014 | Cok |
| 8,854,294 B2 | 10/2014 | Sakariya |
| 8,865,489 B2 | 10/2014 | Rogers et al. |
| 8,877,648 B2 | 11/2014 | Bower et al. |
| 8,889,485 B2 | 11/2014 | Bower |
| 8,895,406 B2 | 11/2014 | Rogers et al. |
| 8,934,259 B2 | 1/2015 | Bower et al. |
| 8,941,215 B2 | 1/2015 | Hu et al. |
| 8,987,765 B2 | 3/2015 | Bibl et al. |
| 9,105,714 B2 | 8/2015 | Hu et al. |
| 9,111,464 B2 | 8/2015 | Bibl et al. |
| 9,142,468 B2 | 9/2015 | Bower et al. |
| 9,153,171 B2 | 10/2015 | Sakariya et al. |
| 9,161,448 B2 | 10/2015 | Menard et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,307,652 B2 | 4/2016 | Bower |
| 9,358,775 B2 | 6/2016 | Bower et al. |
| 9,367,094 B2 | 6/2016 | Bibl et al. |
| 9,368,683 B1 | 6/2016 | Meitl et al. |
| 9,401,344 B2 | 7/2016 | Bower et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,601,356 B2 | 3/2017 | Bower et al. |
| 9,640,715 B2 | 5/2017 | Bower et al. |
| 9,704,821 B2 | 7/2017 | Meitl et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,865,832 B2 | 1/2018 | Bibl et al. |
| 9,923,133 B2 | 3/2018 | Bower et al. |
| 9,929,053 B2 | 3/2018 | Bower et al. |
| 10,103,069 B2 | 10/2018 | Bower et al. |
| 10,153,256 B2 | 12/2018 | Cok et al. |
| 10,157,880 B2 | 12/2018 | Bonafede et al. |
| 10,163,735 B2 | 12/2018 | Bower et al. |
| 2001/0040298 A1 | 11/2001 | Baba et al. |
| 2003/0141570 A1 | 7/2003 | Chen et al. |
| 2003/0183947 A1 | 10/2003 | Ohuchi |
| 2004/0051110 A1* | 3/2004 | Oohata ............... H01L 33/38 257/89 |
| 2005/0202595 A1 | 9/2005 | Yonehara et al. |
| 2007/0173034 A1 | 7/2007 | Tsurume et al. |
| 2008/0164575 A1 | 7/2008 | Ikeda et al. |
| 2009/0014205 A1 | 1/2009 | Kobayashi et al. |
| 2009/0133914 A1 | 5/2009 | Dellmann et al. |
| 2010/0096175 A1 | 4/2010 | Ishimatsu et al. |
| 2010/0147567 A1 | 6/2010 | Hino et al. |
| 2010/0190293 A1 | 7/2010 | Maeda et al. |
| 2010/0306993 A1 | 12/2010 | Mayyas et al. |
| 2011/0074024 A1* | 3/2011 | Pendse ............... H01L 24/12 257/737 |
| 2011/0140271 A1 | 6/2011 | Daubenspeck et al. |
| 2011/0182805 A1 | 7/2011 | DeSimone et al. |
| 2012/0043130 A1 | 2/2012 | Rathburn |
| 2012/0118939 A1 | 5/2012 | Kusanagi et al. |
| 2012/0126229 A1 | 5/2012 | Bower |
| 2012/0168776 A1 | 7/2012 | Nakamura et al. |
| 2012/0228669 A1 | 9/2012 | Bower et al. |
| 2012/0256346 A1 | 10/2012 | Ogino et al. |
| 2013/0001633 A1* | 1/2013 | Imai ............... H01L 33/60 257/99 |
| 2013/0273695 A1 | 10/2013 | Menard et al. |
| 2013/0316487 A1 | 11/2013 | de Graff et al. |
| 2013/0333094 A1 | 12/2013 | Rogers et al. |
| 2013/0337608 A1 | 12/2013 | Kotani et al. |
| 2014/0252604 A1 | 9/2014 | Motoyoshi |
| 2014/0264763 A1 | 9/2014 | Meitl et al. |
| 2015/0028362 A1 | 1/2015 | Chan et al. |
| 2015/0348926 A1 | 12/2015 | Bower |
| 2016/0018094 A1 | 1/2016 | Bower et al. |
| 2016/0020120 A1 | 1/2016 | Bower et al. |
| 2016/0020127 A1 | 1/2016 | Bower et al. |
| 2016/0020131 A1 | 1/2016 | Bower et al. |
| 2016/0056223 A1 | 2/2016 | Bower et al. |
| 2016/0093600 A1 | 3/2016 | Bower et al. |
| 2016/0111387 A1 | 4/2016 | Dang et al. |
| 2016/0218264 A1* | 7/2016 | Tischler ............... H01L 25/0655 |
| 2017/0047303 A1 | 2/2017 | Meitl et al. |
| 2017/0048976 A1* | 2/2017 | Prevatte ............... H01L 24/06 |
| 2017/0173852 A1 | 6/2017 | Moore et al. |
| 2017/0186740 A1* | 6/2017 | Cok ............... H01L 22/14 |
| 2017/0213803 A1 | 7/2017 | Bower |
| 2017/0256521 A1 | 9/2017 | Cok et al. |
| 2018/0031974 A1 | 2/2018 | Prevatte et al. |
| 2018/0166337 A1 | 6/2018 | Bower et al. |

OTHER PUBLICATIONS

Cok, R. S. et al., 60.3: AMOLED Displays Using Transfer-Printed Integrated Circuits, Society for Information Display, 10:902-904, (2010).

Cok, R. S. et al., AMOLED displays with transfer-printed integrated circuits, Journal of the SID, 19(4):335-341, (2011).

Cok, R. S. et al., Inorganic light-emitting diode displays using micro-transfer printing, Journal of the SID, 25(10):589-609, (2017).

Delmdahl, R. et al., Large-area laser-lift-off processing in micro-electronics, Physics Procedia 41:241-248 (2013).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Hamer, J. W. et al., 63.2: AMOLED Displays using Transfer-Printed Integrated Circuits, SID 09 Digest, 40(2):947-950 (2009).

(56) References Cited

OTHER PUBLICATIONS

Howlader, M. M. R. et al., Nanobonding Technology Toward Electronic, Fluidic, and Photonic Systems Integration, IEEE, Journal of Selected Topics in Quantum Electronics, 17(3):689-703, (2011).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructural elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel. B. et al., Printing meets lithography: Soft approaches to high-resolution patterning, J. Res. & Dev. 45(5):697-708, (2001).

Trindade, A. J. et al., Precision transfer printing of ultra-thin AlInGaN micron-size light-emitting diodes, Crown, 978-1-4577-1507-5/13:217-218 (2012).

\* cited by examiner

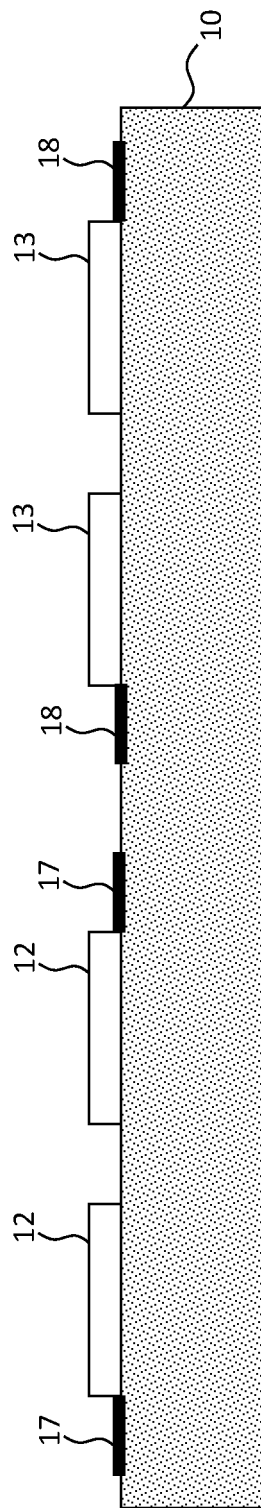
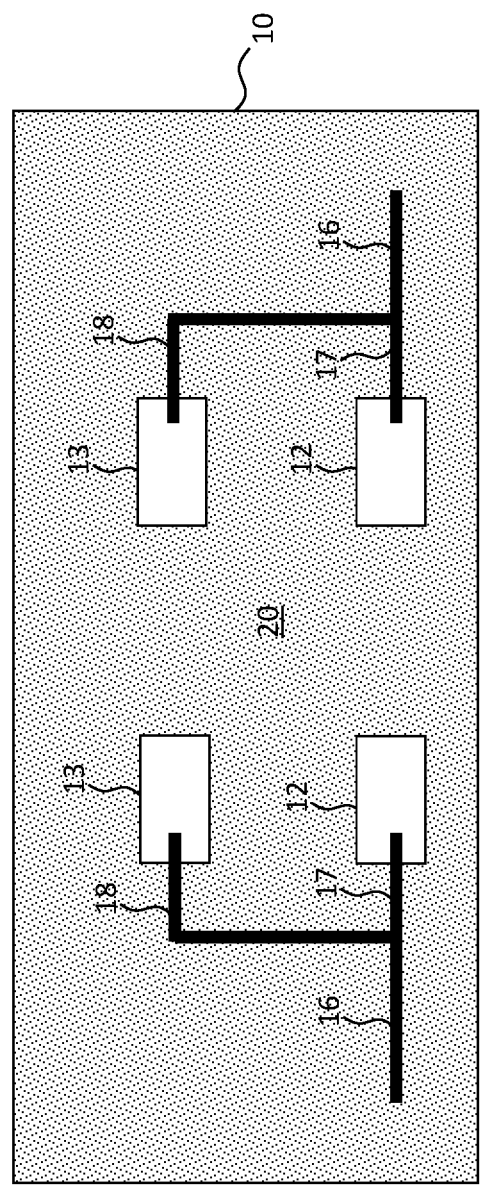
FIG. 4A
FIG. 4B

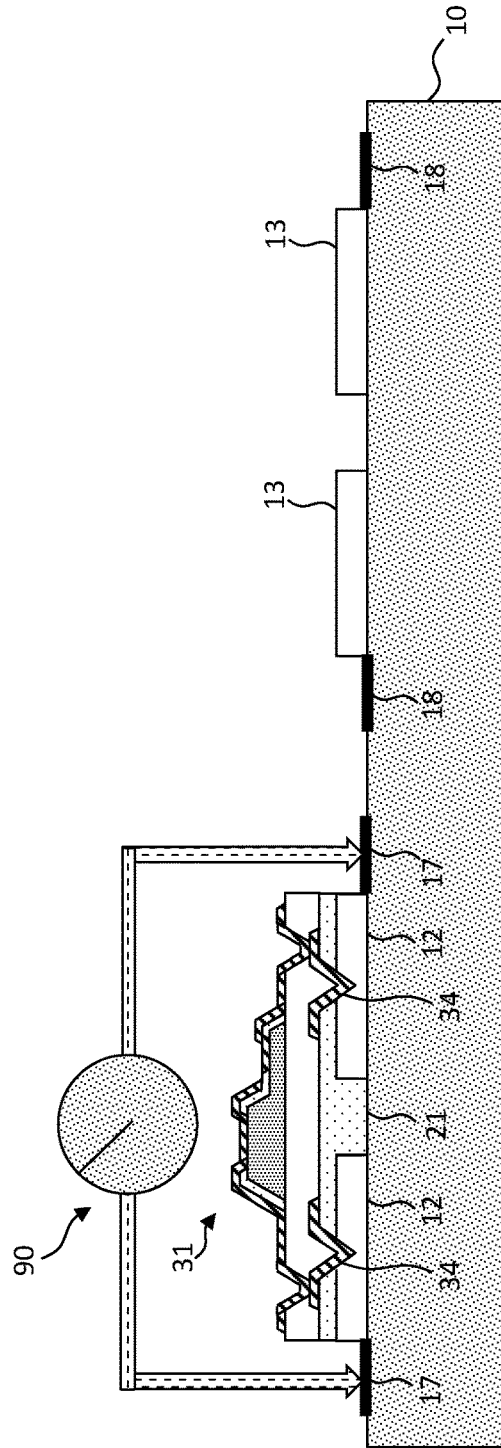
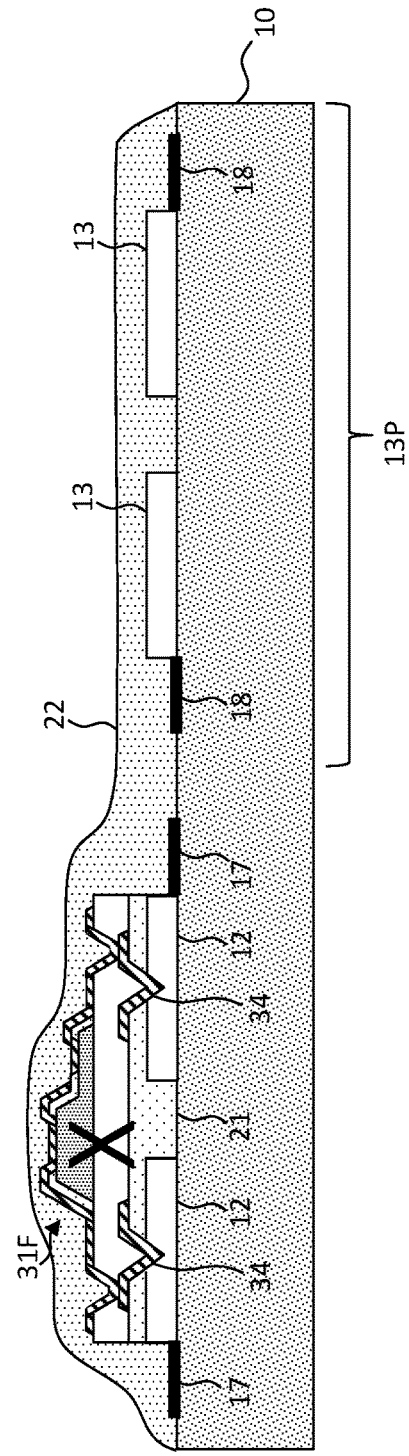

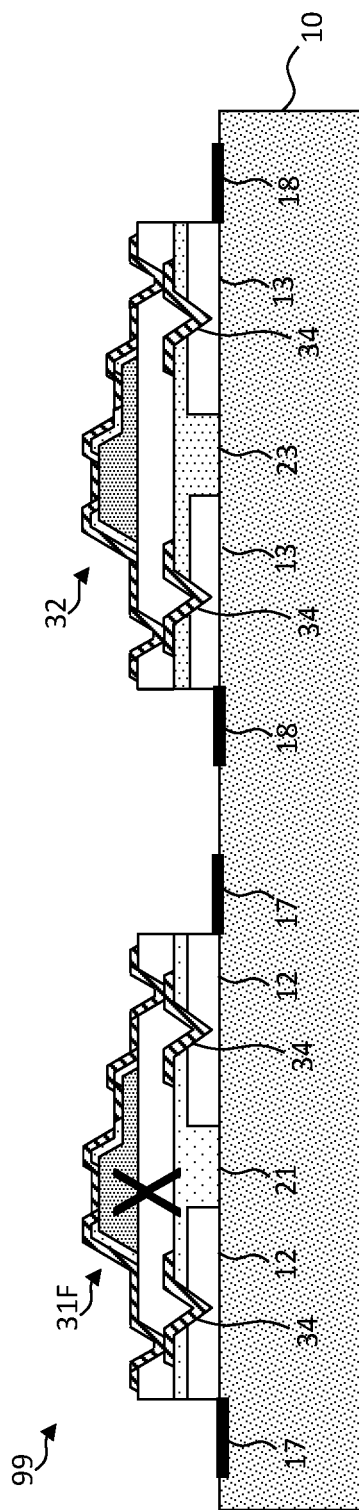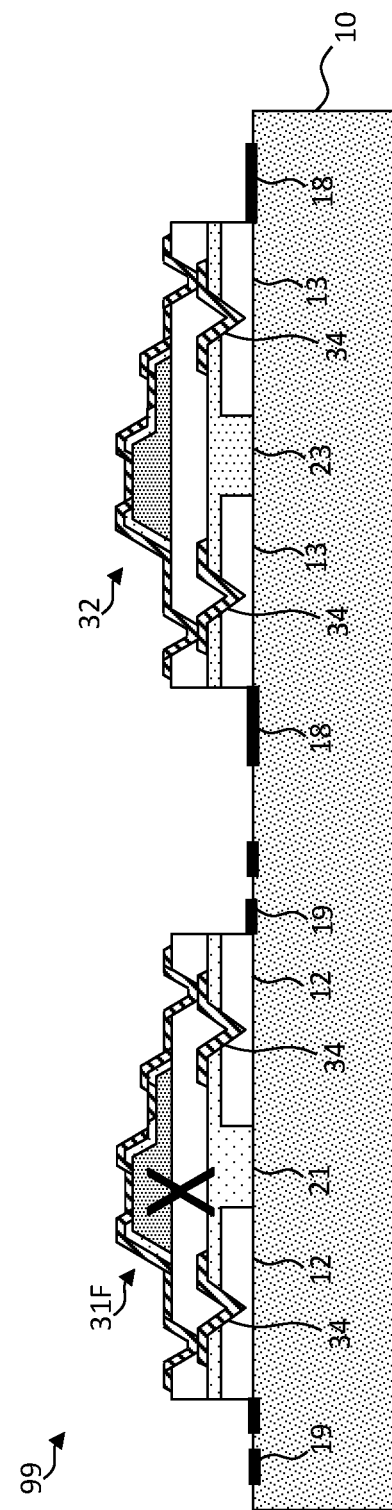

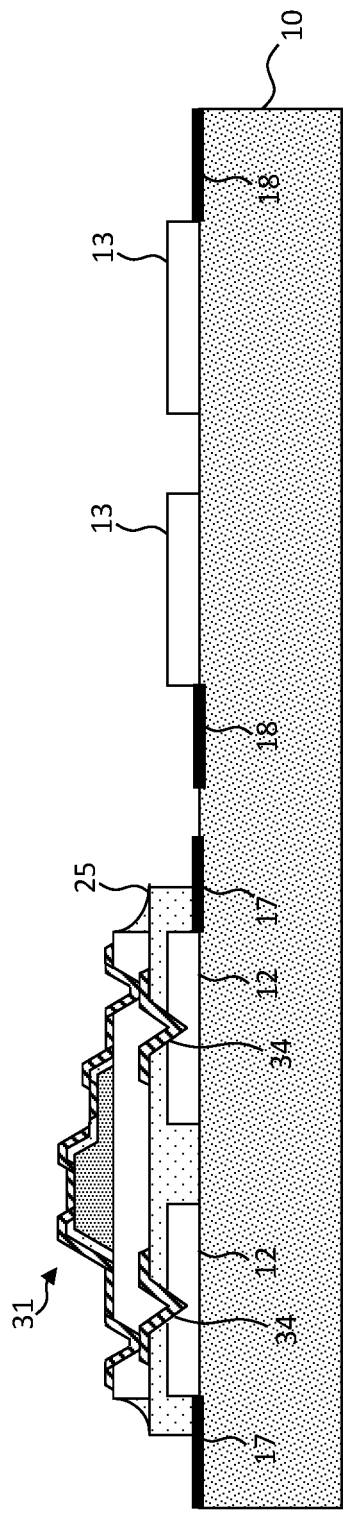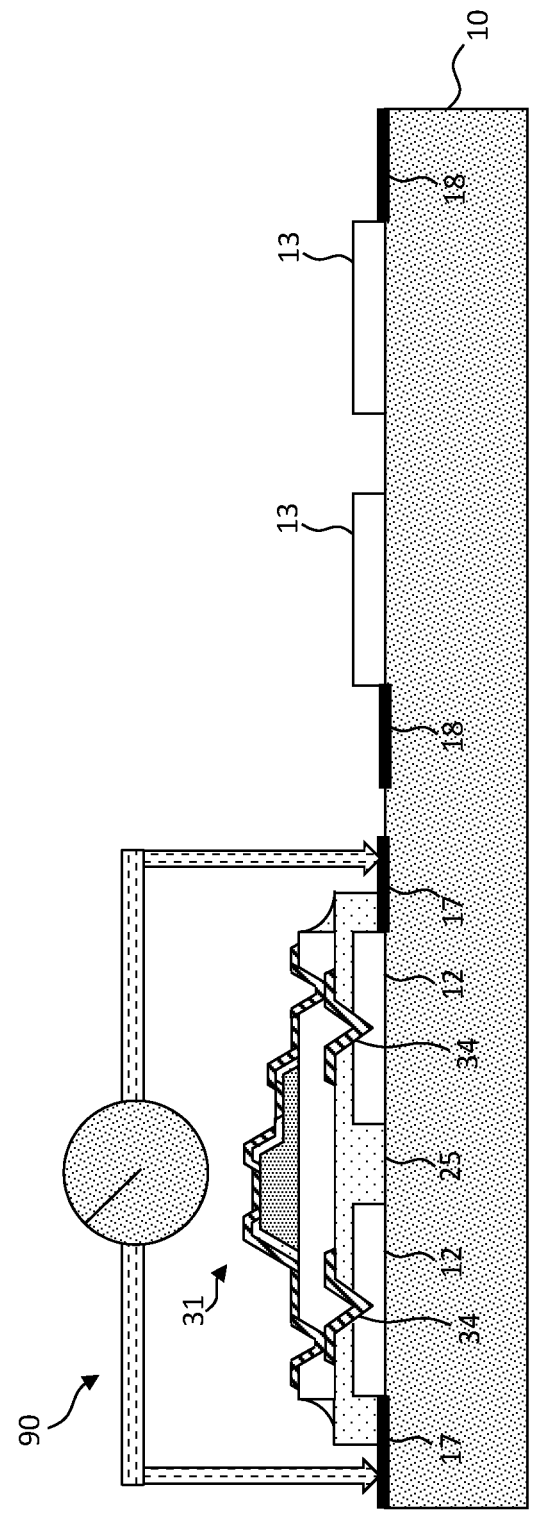

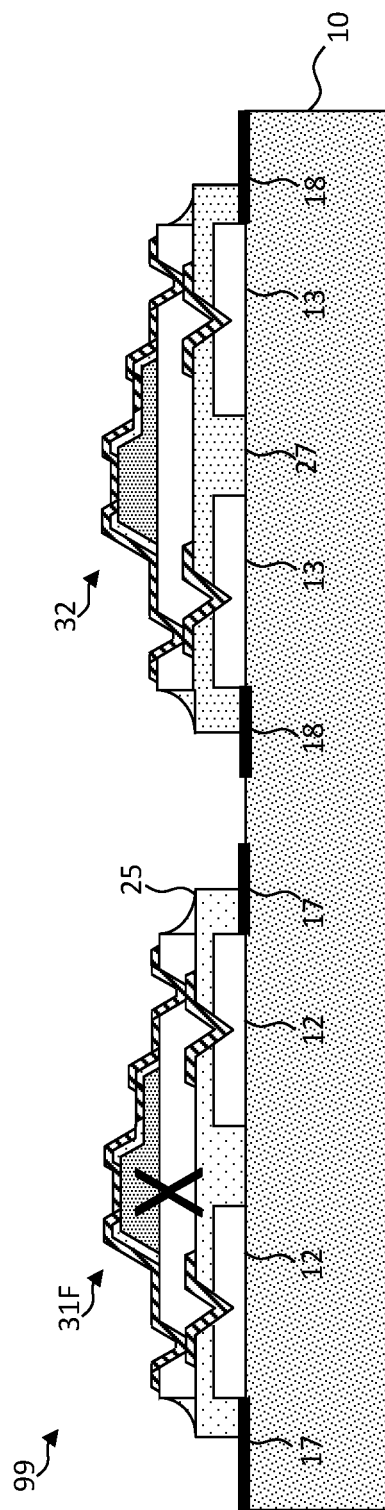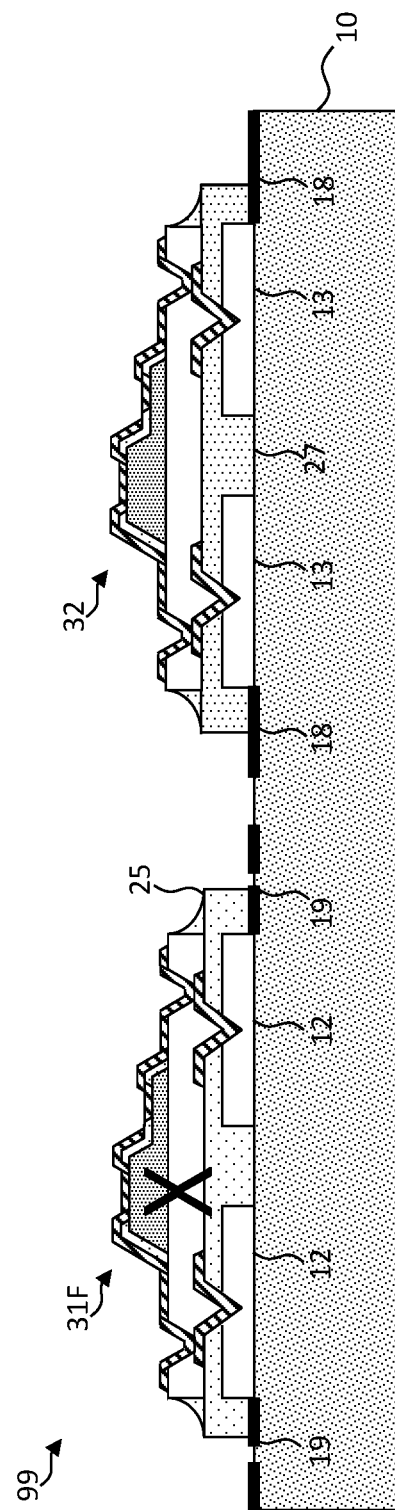

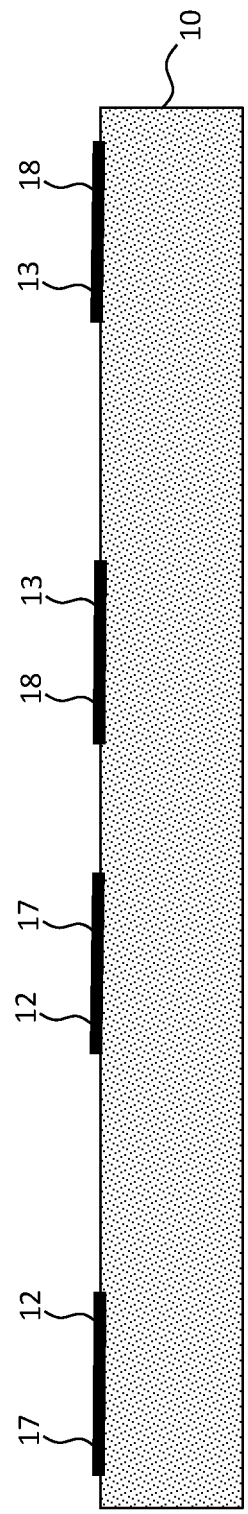
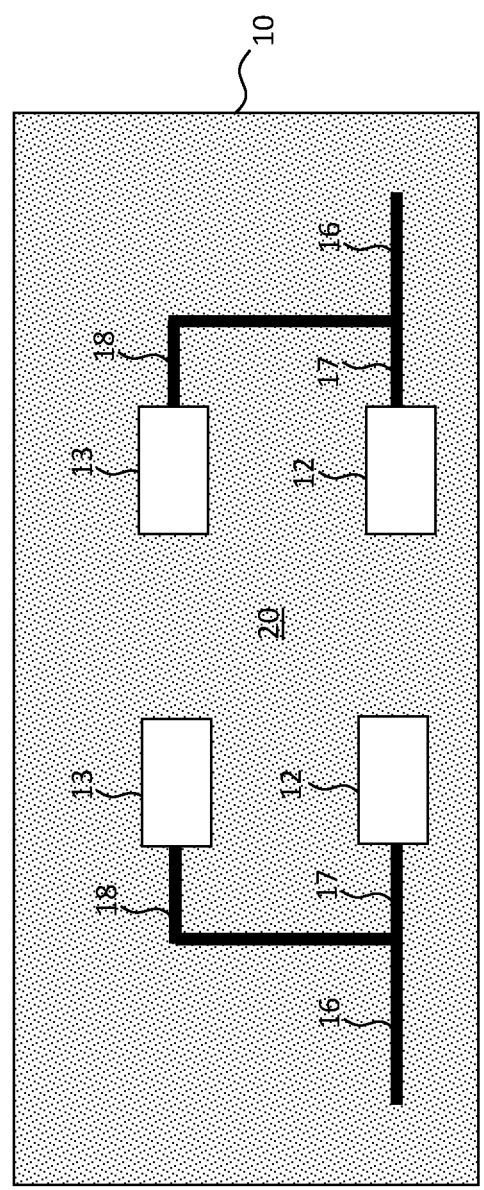

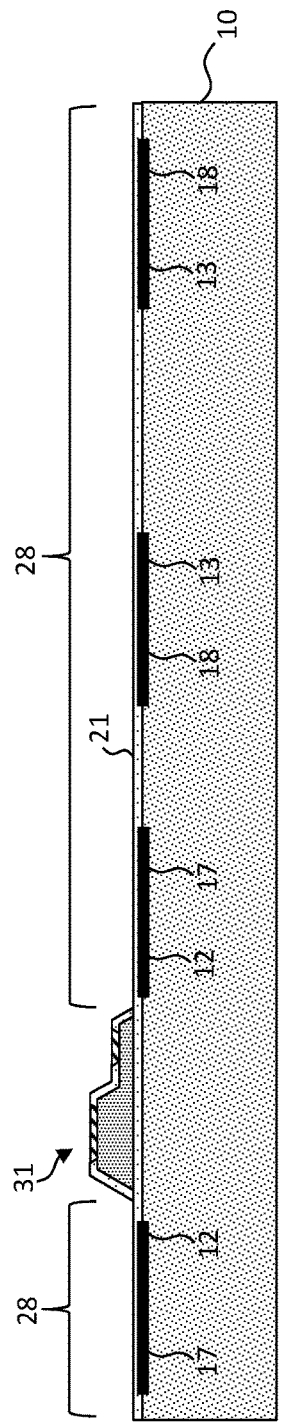
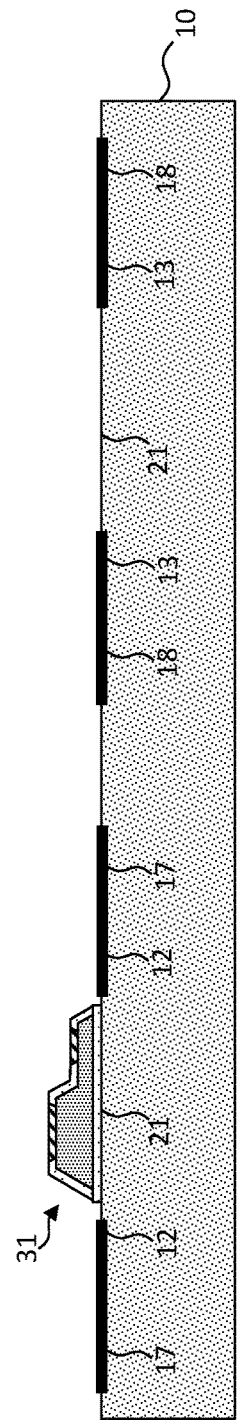
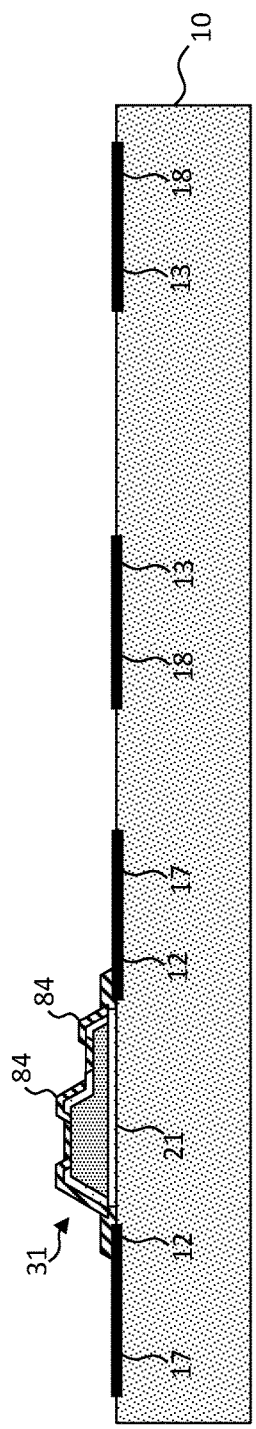

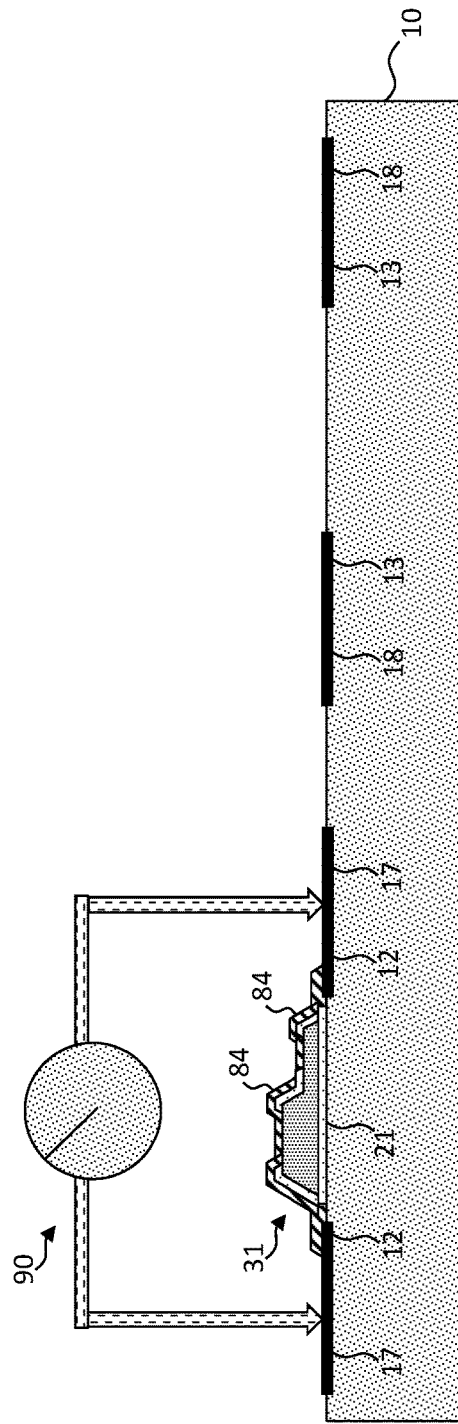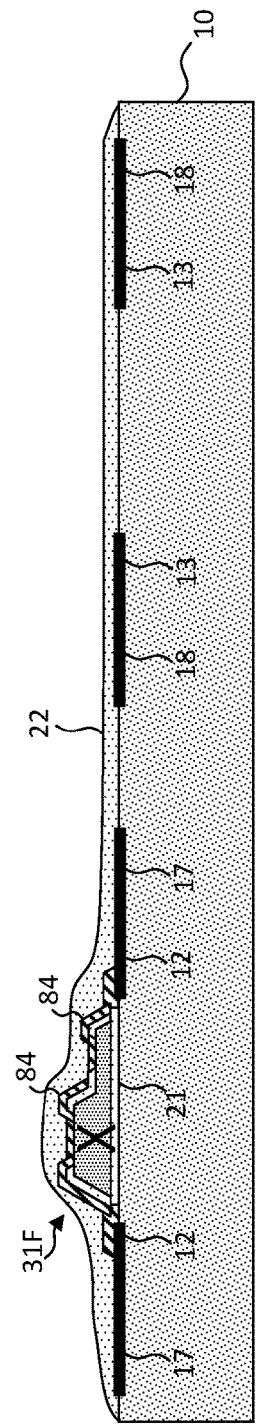
FIG. 9H
FIG. 9I

PRESSURE-ACTIVATED ELECTRICAL INTERCONNECTION WITH ADDITIVE REPAIR

CROSS REFERENCE TO RELATED APPLICATION

Reference is made to U.S. patent application Ser. No. 15/461,703, entitled Pressure Activated Electrical Interconnection by Micro-Transfer Printing by Christopher Bower et al., to U.S. Pat. No. 8,889,485, entitled Methods for Surface Attachment of Flipped Active Components by Christopher Bower, to U.S. patent application Ser. No. 14/822,864, entitled Chiplets with Connection Posts by Prevatte et al., to U.S. patent application Ser. No. 14/743,788, entitled Micro-Assembled LED Displays and Lighting Elements by Bower et al., and to U.S. patent application Ser. No. 15/373,865, entitled Micro-Transfer Printable LED Component by Cok et al., the disclosure of each of which is hereby incorporated herein by reference in its entirety.

TECHNICAL FIELD

The present invention relates generally to structures and methods for electrically interconnecting chiplets to backplane electrical contact pads using micro transfer printing and, in particular, to methods and structures for repairing micro-transfer printed backplanes with faulty chiplets.

BACKGROUND

Substrates with electronically active components distributed over the extent of the substrate may be used in a variety of electronic systems, for example, in flat-panel display devices such as flat-panel liquid crystal or organic light emitting diode (OLED) displays, in imaging sensors, and in flat-panel solar cells. A variety of methods may be used to distribute electronically active circuits over substrates, for example forming a pattern of electronically active circuits in a thin film on the substrate or forming the components on separate source substrates and transferring the circuits to the substrate. In the latter case, a variety of assembly technologies for device packaging may be used.

Micro-transfer-printing is an advanced assembly technology for various applications including those that benefit from heterogeneous integration of high-performance micro-scale devices on a common substrate. Micro-device systems compatible with micro-transfer-printing include silicon integrated circuits, solar cells, light emitting diodes, compound semiconductor transistors, and lasers.

In micro-transfer-printing, engineered transfer devices (e.g., viscoelastic elastomer stamps) are used to pick up and transfer components (e.g., arrays of components) from a source substrate or wafer (e.g., a native source substrate or wafer on or in which the components are formed) onto one or more non-native destination substrates. Exemplary components can be fabricated using mature materials and processes and can be, for example, made print-compatible using micromachining or etching processes which leave the micro-components undercut from the source (e.g., native) wafer. In certain embodiments, the undercut components remain fixed to the native source wafer through tethering structures connected to non-undercut anchors. In certain embodiments, conventional photolithographic methods are then used to form thin-film metal traces which interconnect the printed device arrays on the substrate.

Exemplary micro-transfer printing methods for transferring active components from one substrate to another are described in *AMOLED Displays using Transfer-Printed Integrated Circuits* published in the Proceedings of the 2009 Society for Information Display International Symposium Jun. 2-5, 2009, in San Antonio Tex., US, vol. 40, Book 2, ISSN 0009-0966X, paper 63.2 p. 947. In this exemplary approach, small integrated circuits are formed over a buried oxide layer on the process side of a crystalline wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate or backplane coated with an adhesive and thereby adhered to the destination substrate. The adhesive is subsequently cured. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In such exemplary systems it is necessary to electrically connect the small integrated circuits or chiplets to electrically conductive elements such as backplane contact pads on the destination substrate. By applying electrical signals to conductors on the destination substrate, the small integrated circuits are energized and made operational. The electrical connections between the small integrated circuits and the backplane contact pads are typically made by photolithographic processes in which a metal is evaporated or sputtered onto the small integrated circuits and the destination substrate to form a metal layer, the metal layer is coated with a photoresist that is exposed to a circuit connection pattern, and the metal layer and photoresist are developed by etching and washing to form the patterned electrical connections between the small integrated circuits and the contact pads on the destination substrate.

There is an on-going need for reliable structures and methods that enable the electrical interconnection of small integrated circuits, such as micro-transfer printed chiplets, to destination substrates.

SUMMARY

In accordance with certain embodiments of the present invention, a method of making a repaired electrical connection structure comprises providing a substrate having first and second contact pads electrically connected in parallel, providing first and second functionally identical components, disposing a first adhesive layer the substrate, transferring (e.g., micro-transfer printing) the first component onto the first adhesive layer, electrically connecting the first component to the first contact pad, testing the first component to determine if the first component is a faulty component and, if the first component is a faulty component, disposing a second adhesive layer on the substrate and transferring (e.g., micro-transfer printing) the second component onto the second adhesive layer, and electrically connecting the second component to the second contact pad. The first and second adhesive layers can be unpatterned or patterned and the first and second components can be electrically connected to the first and second contact pads, respectively, with connection posts or photolithographically defined electrodes.

In one aspect, the present invention is directed to a method of making a repaired electrical connection structure comprises providing a substrate comprising a first contact pad and a second contact pad electrically connected (e.g., in parallel) with the first contact pad, providing one or more component source wafers comprising a first component and a second component functionally identical to the first component, disposing a first adhesive layer over and in contact with at least a first portion of the substrate, wherein the first portion is adjacent to, on, or adjacent to and on the first contact pad, transferring (e.g., micro-transfer printing) the first component onto the first adhesive layer so that (i) the first component is in alignment with the first contact pad and (ii) the first adhesive layer contacts at least a portion of the first component between the first component and the substrate, testing the first component to determine if the first component is a faulty component, and if the first component is a faulty component, disposing a second adhesive layer over and in contact with at least a second portion of the substrate, wherein the second portion is adjacent to, on, or adjacent to and on the second contact pad and transferring (e.g., micro-transfer printing) the second component onto the second adhesive layer so that (i) the second component is in alignment with the second contact pad and (ii) the second adhesive layer contacts at least a portion of the second component between the second component and the substrate.

According to some embodiments of the present invention, the substrate is provided with a first wire disposed on, over, or in the substrate and electrically connected to the first contact pad and the method further comprises cutting the first wire or destroying the first component if the first component is a faulty component. According to some embodiments of the present invention, (i) the first adhesive layer is disposed as an unpatterned blanket deposition over the substrate, (ii) the second adhesive layer is disposed as an unpatterned blanket deposition over the substrate, or (iii) both (i) and (ii). If the first adhesive layer is disposed as an unpatterned blanket deposition over the substrate, the method can comprise removing at least a portion of the first adhesive layer from the second contact pad. According to some embodiments of the present invention, (i) the first adhesive layer is disposed as a patterned deposition over the first contact pad, (ii) the second adhesive layer is disposed as a patterned deposition over the second contact pad, or (iii) both (i) and (ii).

In certain embodiments, the first component is determined to be a faulty component.

According to some embodiments of the present invention, the first component is aligned with the first contact pad and disposed over or laterally adjacent to the first contact pad, (i) the second component is aligned with and disposed over or laterally adjacent to the second contact pad, or (iii) both (i) and (ii).

According to some embodiments of the present invention, (i) the first adhesive layer is cured, (ii) the second adhesive layer is cured, or (iii) both the first adhesive layer and the second adhesive layer are cured. According to some embodiments of the present invention, (i) the first adhesive layer is thermally cured, (ii) the second adhesive layer is thermally cured, (iii) the first adhesive layer is radiation cured, (iv) the second adhesive layer is radiation cured, (v) the first adhesive layer is thermally cured and the second adhesive is radiation cured, or (vi) the first adhesive layer is radiation cured and the second adhesive layer is thermally cured.

According to some embodiments of the present invention, (i) a first electrode is formed in electrical contact with the first component and the first contact pad, (ii) a second electrode is formed in electrical contact with the second component and the second contact pad, or (iii) both (i) and (ii). According to some embodiments of the present invention, (i) the first component comprises a first connection post, (ii) the second component comprises a second connection post, or (iii) both (i) and (ii). According to some embodiments of the present invention, the first connection post is contacted to the first contact pad, (ii) the second connection post is contacted to the second contact pad, or (iii) both (i) and (ii), as a consequence of transfer (e.g., micro-transfer printing). According to some embodiments, the first connection post is disposed above the first contact pad, (ii) the second connection post is disposed above the second contact pad, or (iii) both (i) and (ii), as a consequence of transfer (e.g., micro-transfer printing).

According to some embodiments of the present invention, the first adhesive layer is cured such that the first connection post is pressed into electrical contact with the first contact pad, (ii) the second adhesive layer is cured such that the second connection post is pressed into electrical contact with the second contact pad, or (iii) both (i) and (ii).

According to certain embodiments of the present invention, the method comprises providing solder disposed on the first or second or both first and second contact pads. According to certain embodiments of the present invention, the method comprises heating the solder to a melting temperature and causing the solder to flow into electrical contact with the first connection post, the second connection post, or both the first and second connection posts. According to certain embodiments of the present invention, the method comprises heating the solder before curing the first adhesive layer.

In some embodiments of the present invention, the first adhesive layer comprises a thermally curable resin that cures at a cure temperature greater than or equal to the melting temperature and the method comprises the steps of curing the first adhesive layer and heating the solder in a common step.

In some embodiments of the present invention, the first adhesive layer comprises a radiation-curable resin and the method comprises the step of curing the first adhesive layer with radiation at a temperature greater than or equal to the melting temperature.

In some embodiments of the present invention, the one or more component source wafers comprises a third component functionally identical to the first and second components and the method comprises providing a substrate having a third contact pad electrically connected in parallel with the first contact pad and with the second contact pad, testing the second component to determine if the second component is a faulty component and, if the second component is a faulty component, disposing a third adhesive layer over and in contact with at least a third portion of the substrate adjacent to, on or, adjacent to and on the third contact pad and transferring (e.g., micro-transfer printing) the third component onto the third adhesive layer so that (i) the third component is in alignment with the third contact pad and (ii) the third adhesive layer contacts at least a portion of the third component between the third component and the substrate.

In certain embodiments, (i) the step of transferring the first component onto the first adhesive layer comprises micro-transfer printing the first component, (ii) the step of transferring the second component onto the second adhesive layer comprises micro-transfer printing the second component, or both (i) and (ii).

In another aspect, the present invention is directed to a repaired electrical connection structure, comprising: a substrate comprising a first contact pad and a second contact pad electrically connected in parallel with the first contact pad;

a first adhesive layer disposed over and in contact with at least a first portion of the substrate, wherein the first portion is adjacent to, on, or adjacent to and on the first contact pad; a first component disposed in alignment with the first contact pad, wherein the first adhesive layer contacts at least a portion of the first component between the first component and the substrate; a second adhesive layer disposed over and in contact with at least a second portion of the substrate, wherein the second portion is adjacent to, on, or adjacent to and on the second contact pad; and a second component disposed in alignment with the second contact pad, wherein the second adhesive layer contacts at least a portion of the second component between the second component and the substrate, wherein the first adhesive layer comprises a first material and the second adhesive layer comprises a second material different than the first material.

The present invention provides, inter alia, structures and methods that enable small components to be transfer printed on a substrate adhesive layer. If a first component is faulty, a redundant second component electrically connected in parallel with the first component is disposed on a second adhesive layer on the substrate to repair the structure.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 4A, 4C, 4D, 4E, 4F, 4G, 4H, 4I, 4J, 4K, 4L, and 4M are successive cross sections of structures formed during a method, according to illustrative embodiments of the present invention;

FIGS. 4B and 4N are plan views of the structures shown in FIGS. 4A and 4M, respectively, according to illustrative embodiments of the present invention;

FIGS. 8A-8H are successive cross sections of structures formed during a method, according to illustrative methods of the present invention;

FIGS. 9A, 9C, 9D, 9E, 9F, 9G, 9H, 9I, 9J, 9K, and 9L are successive cross sections of structures formed during a method, according to illustrative embodiments of the present invention;

FIGS. 9B and 9M are plan views of the structures shown in FIGS. 9A and 9L, respectively, according to illustrative embodiments of the present invention.

Figure 1:
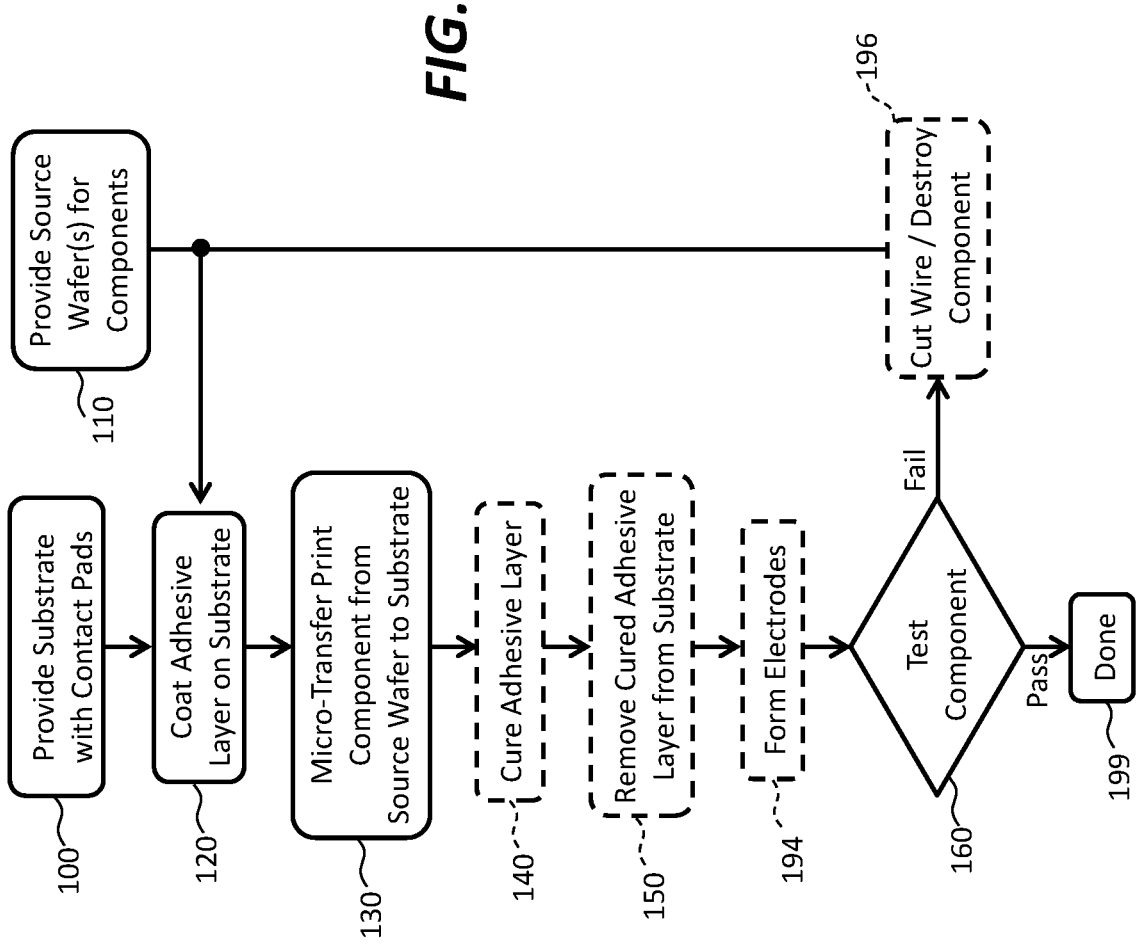
FIGS. 1 and 2 are flow diagrams of methods according to illustrative embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Certain embodiments of the present invention are directed toward repairing micro-transfer printed substrates. In accordance with some embodiments of the present invention and as exemplified in the illustrative figures, components such as chiplets incorporating active electronic elements such as transistors or passive elements such as resistors, capacitors, and conductors are transferred (e.g., micro-transfer printed) from one or more native source wafers to a non-native destination substrate or backplane with electrical contact pads and interconnected with wires. In certain embodiments, a component comprises a combination of passive and active elements. In some embodiments, components are LEDs, electrical connection jumpers, or integrated logic circuits, or a combination of such elements. Components can comprise circuits, for example any structure responsive to, controlling, or conducting electrical energy, such as an active circuit including analog or digital circuits, a transistor, or an LED, or a passive circuit including conductive wire, resistors, or capacitors. Components can be an integrated circuit or include an integrated circuit on a component substrate separate from, for example, the integrated circuit and the destination substrate.

In some embodiments, micro-transfer printed components are electrically connected with electrodes to contact pads or wires on a destination substrate. In some embodiments of the present invention, components include one or more electrically conducting connection posts that each protrude in a direction away from a component surface and are brought into contact with a contact pad on a destination substrate to form an electrical connection between the component and the contact pad on the destination substrate. Components can be at least partially adhered to a destination substrate by forcefully driving component connection posts into substrate contact pads when micro-transfer printing, for example by exerting mechanical pressure on a transfer stamp (e.g., an elastomer stamp) used to transfer the components.

In some embodiments of the present invention, an adhesive layer, such as a layer of resin, polymer, or epoxy, either curable or non-curable, adheres components to a destination substrate. An adhesive layer can be disposed over a substrate and contact pads in an unpatterned layer, for example by coating or lamination. In some embodiments, an adhesive layer is disposed in a pattern, for example over contact pads or between contact pads, for example using inkjet or photolithographic techniques. Whether patterned or unpatterned, in some embodiments, when heated to cure and shrink the resin in the adhesive layer, the resin flows and wicks over any combination of a substrate, contact pads, any connection posts, and a component. This can reduce the volume between the component and the substrate, drawing the component closer to the substrate and, in particular, embedding any connection posts (i.e., if present) firmly into the contact pads to form or improve an electrical connection between the connection posts and the contact pads. In some embodiments of the present invention, solder is pattern-wise coated on the contact pads and improves an electrical connection between a component (e.g., with or without connection post(s)) and a contact pad.

No manufacturing process is perfect, and in some embodiments of the present invention, at least one component is faulty, at least one component is not properly transferred (e.g., micro-transfer printed) to a destination substrate, or an electrical connection is not properly made between a component and a contact pad, so that the system or structure would not operate as desired without repair. To avoid such an eventuality, the system or structure can be tested, and faulty components identified. Repair components can then be disposed on the substrate in locations adjacent to the faulty components and each repair component is electrically connected (e.g., in parallel) to the faulty component.

Figure 4C:
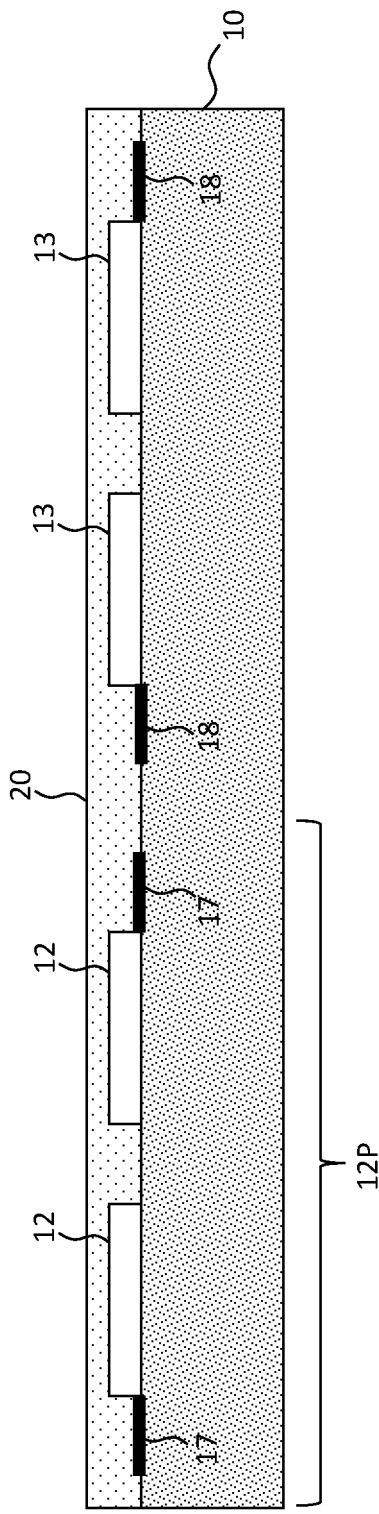
Figure 4D:
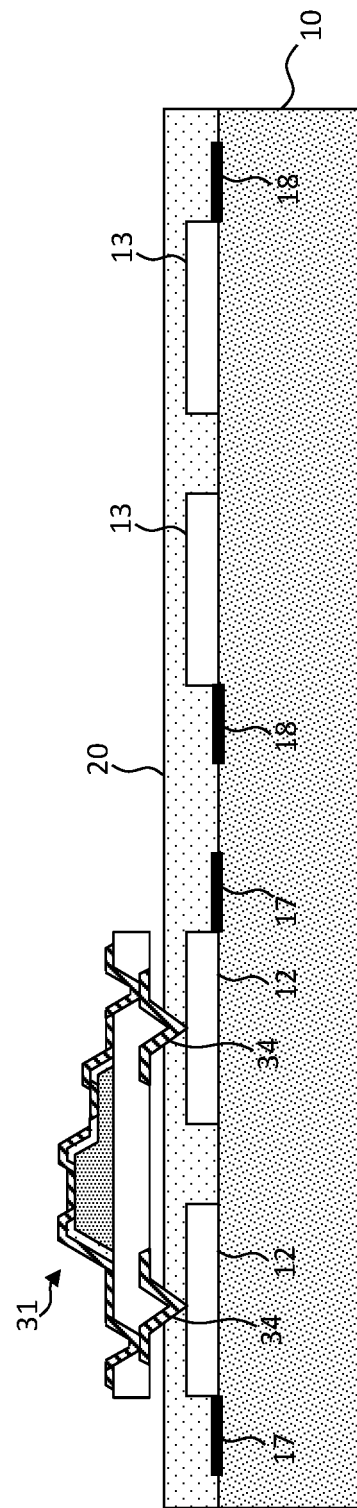
Figure 4E:
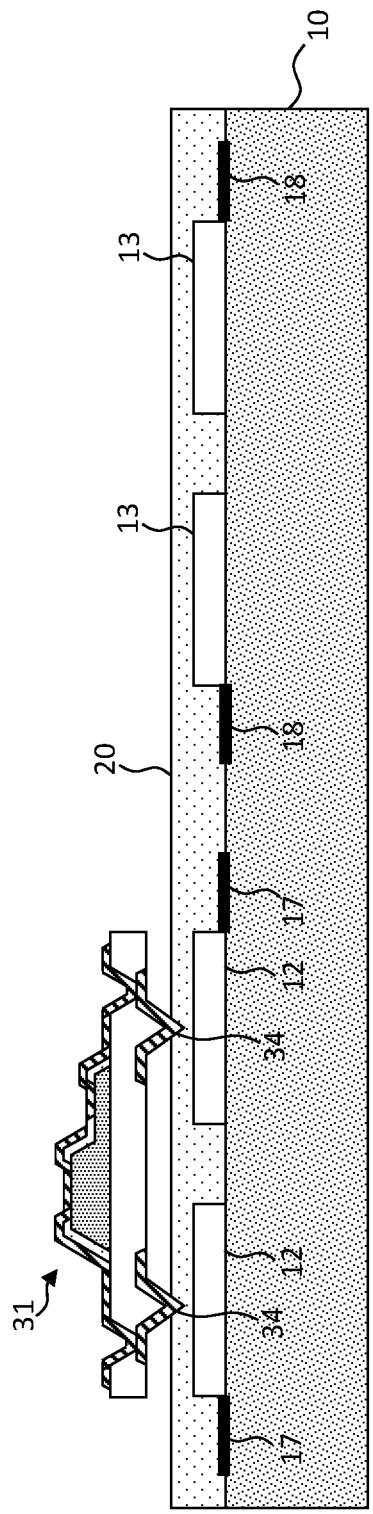
Figure 4F:
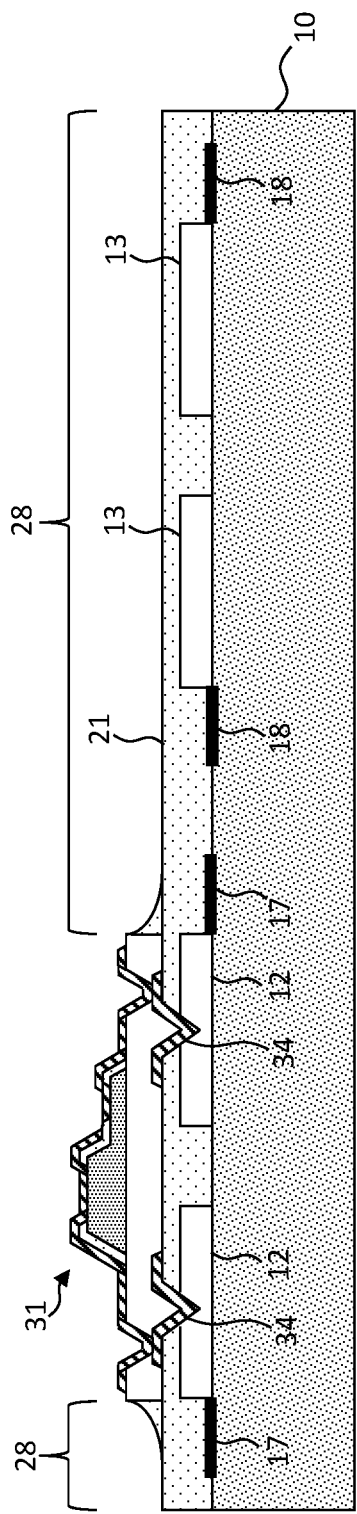
Figure 4G:
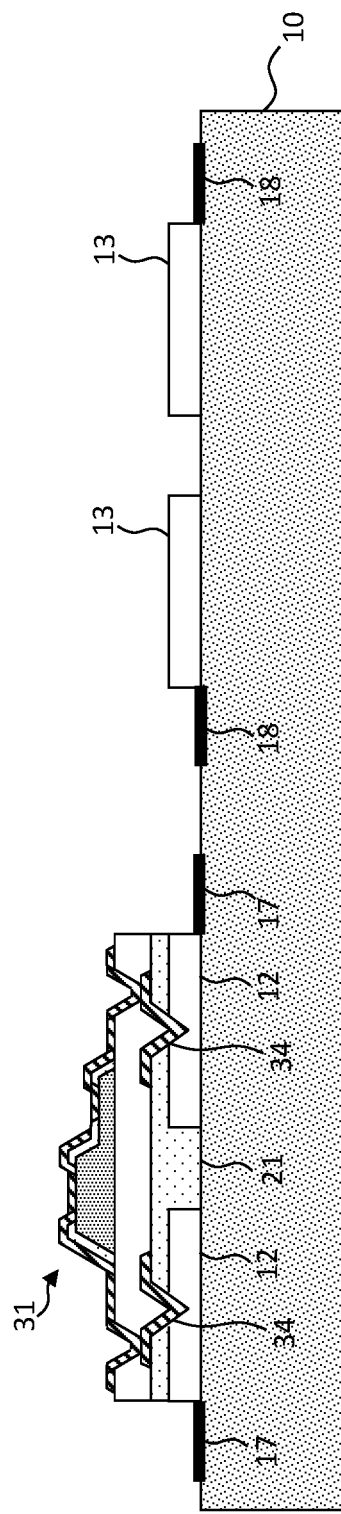
Figure 4J:
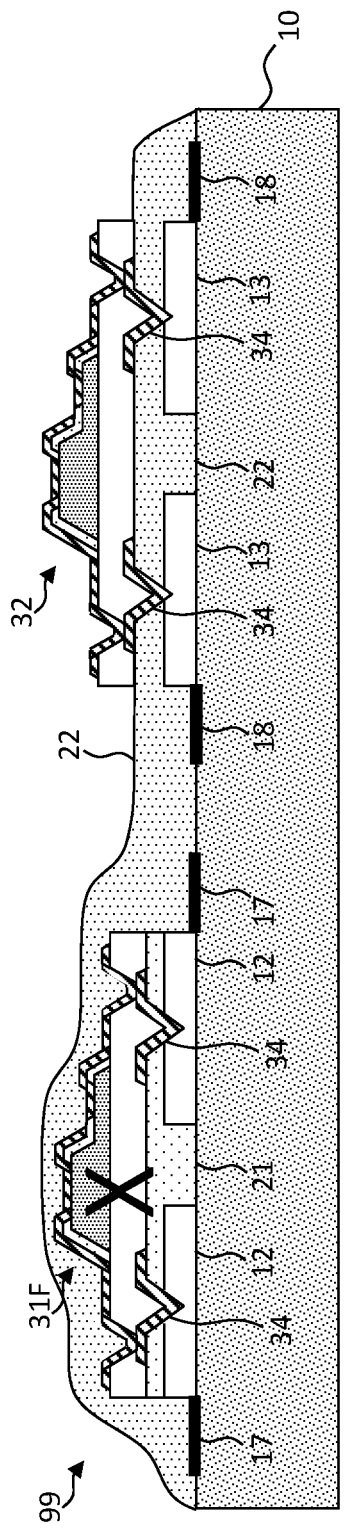
Figure 4K:
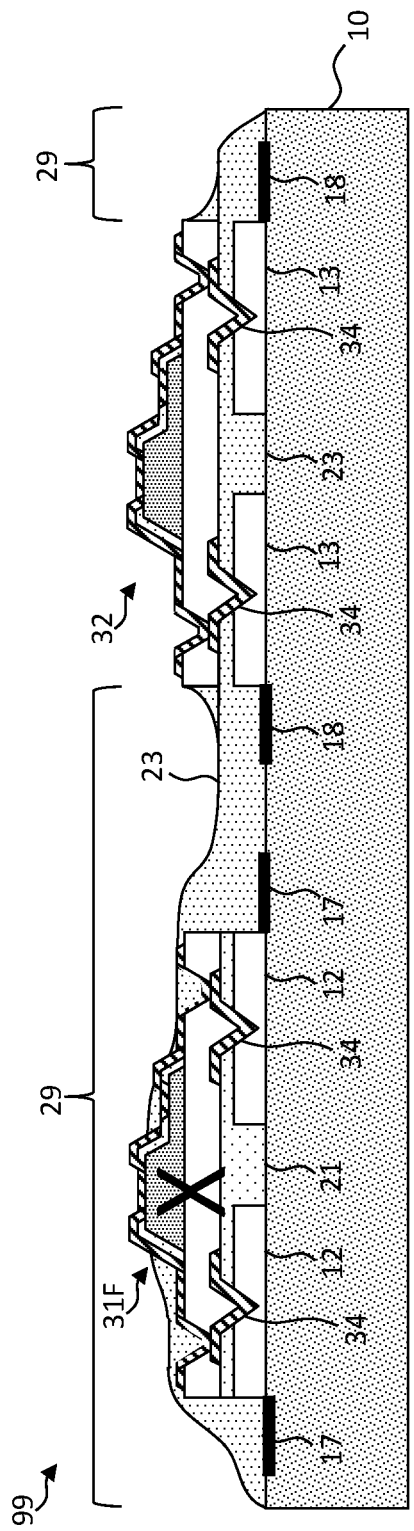
Figure 4N:
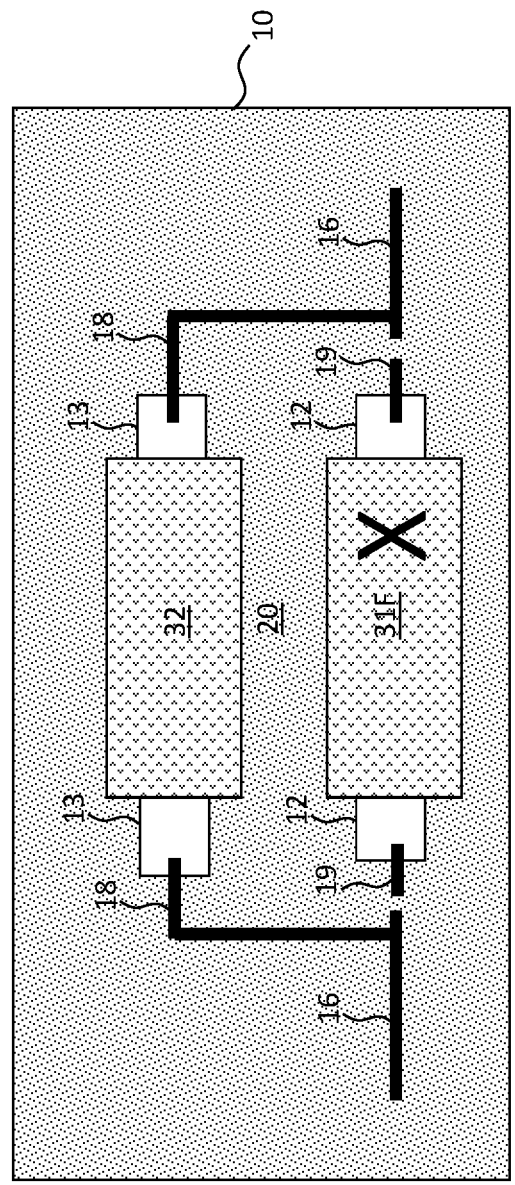

According to some embodiments of the present invention and referring to FIGS. 4A-4N, 8A-8H, and 9A-9M and the generic inventive process of FIG. 1, a method of making a repaired electrical connection structure 99 comprises providing in step 100 a substrate 10 having contact pads, e.g., first contact pads 12 and second contact pads 13, electrically connected in parallel with wires 16, e.g., first wires 17 and second wires 18, as shown in FIGS. 4B and 4N. One or more component source wafers 60 (e.g., as shown in FIGS. 10A, 10B) having functionally identical components 30 are provided in step 110. In step 120, an adhesive layer (e.g., first adhesive layer 20 or second adhesive layer 22) is disposed over and in contact with at least a portion of substrate 10, wherein the portion is adjacent to, on, or, adjacent to or on one of the contact pads. A portion of a substrate 10 can be an area of substrate 10 that is solely adjacent to a contact pad, adjacent to and on a contact pad, or solely on a contact pad. A first portion of a substrate 10 on which an adhesive layer (e.g., first adhesive layer 20 or second adhesive layer 22) is disposed can be immediately adjacent to a second portion of the substrate 10 on which the adhesive layer is disposed. A component 30 is micro-transfer printed to substrate 10 in step 130 so that (i) component 30 is in alignment with the at least one of the contact pads and (ii) an adhesive layer contacts at least a portion of component 30 between component 30 and substrate 10. The adhesive layer can underfill the volume between component 30 and substrate 10. In optional step 140, the adhesive layer is cured and applies compression between micro-transfer printed component 30 and substrate 10 and, in optional step 150 and if necessary, the adhesive layer is partially removed from substrate 10. In optional step 194, electrodes (e.g., first electrodes 84 or second electrodes 85, e.g., as shown in FIG. 10A) are formed or otherwise provided as needed to electrically connect component 30 to the contact pads on substrate 10. In step 160, component 30 is tested to determine if component 30 is a faulty component. The micro-transfer-printed electrical connection structure can be cooled to an operating temperature, for example room temperature, for testing and multiple components 30 can be tested in a single step 160. If component 30 is not a faulty component, the process is done in step 199.

If component 30 is a faulty component, according to some embodiments of the present invention, the micro-transfer printed electrical connection structure can be repaired by disposing another layer of adhesive on substrate 10 in step 120, and the processes of steps 130-160 repeated, adding additional components 30 to substrate 10 to function in the place of tested and faulty components. If any component 30 is a faulty component, an electrical connection to the faulty component, for example a wire 16 disposed on substrate 10, can optionally be cut or faulty component 30 destroyed, for example using a laser, in step 196. As shown in FIG. 1, and according to some embodiments of the present invention, the process of testing components 30 in step 160 to determine faulty components and, if component 30 is a faulty component, disposing additional adhesive layers onto substrate 10, transferring (e.g., micro-transfer printing) additional components 30 onto the additional adhesive layer on substrate 10, and electrically connecting the transferred additional components 30 in parallel can be repeated as often as necessary.

According to various embodiments of the present invention, an adhesive layer (e.g., first adhesive layer 20 or second adhesive layer 22) can be patterned or unpatterned, components 30 can be electrically connected to contact pads with electrodes or connection posts (e.g., as discussed below) or by other means, and solder can be disposed on contact pads or not.

Components 30 can comprise multiple integrated circuits or separate elements, each individually transferred to substrate 10 or can comprise compound structures that comprise multiple integrated circuits or separate element and the compound structures are each transferred as a single unit. For example, a component comprising an intermediate substrate having multiple elements disposed thereon can be transferred from a source substrate or wafer 60 to a destination substrate 10.

Figure 2:
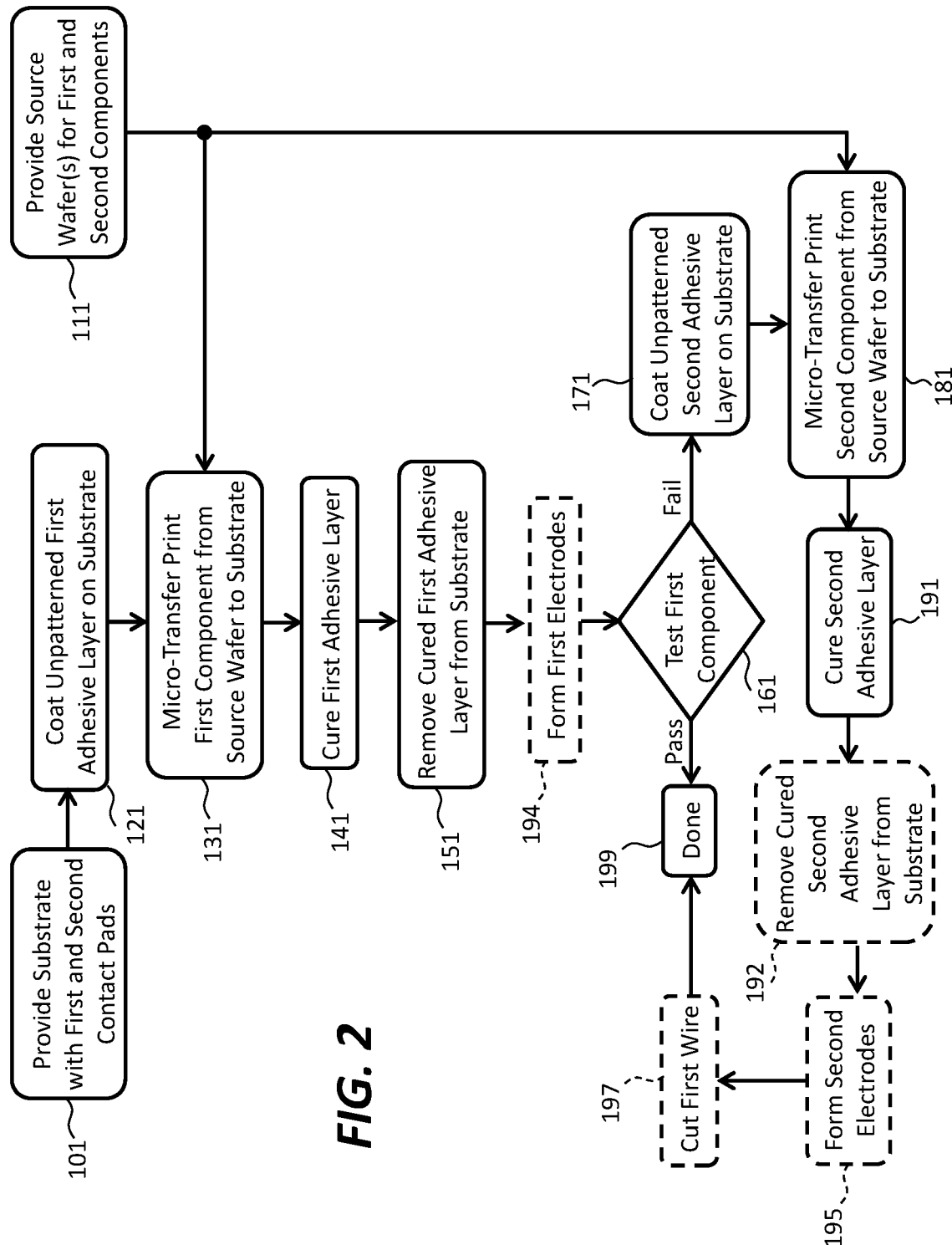

Referring to FIG. 2 and FIGS. 4A-4N, in some embodiments of the present invention employing an unpatterned deposition of adhesive (such as resin) over substrate 10, a method of making a repaired electrical connection structure 99 comprises providing in step 101 a substrate 10 comprising a first contact pad 12 electrically connected to first wires 17 and a second contact pad 13 electrically connected to second wires 18 in parallel with first contact pad 12 and first wires 17. (See FIG. 4A in cross section and FIG. 4B in plan view. For clarity of illustration, the FIG. 4A cross section depicts first and second contact pads 12, 13 in a row, rather than in the more practical, at least in some applications, two-dimensional array of FIG. 4B.) Substrate 10 can comprise multiple first and second contact pads 12, 13, wires 16, and first and second wires 17, 18, for example, as shown in FIGS. 4A and 4B. One or more component source wafers 60 (shown in FIGS. 10A, 10B) comprising a first component 31 and a second component 32 are provided in step 111. Second component 32 is substantially functionally identical to first component 31.

Referring to FIG. 4C, in step 121 an unpatterned first adhesive layer 20 is disposed, for example by drop, spin or curtain coating, over and in contact with at least a first portion 12P of substrate 10, wherein the first portion 12P is adjacent to or on first contact pad 12. In step 131 and as shown in FIG. 4D, first component 31 is micro-transfer printed onto unpatterned first adhesive layer 20 so that (i) first component 31 is in alignment with first contact pad 12 and (ii) unpatterned first adhesive layer 20 contacts at least a portion of first component 31 between first component 31 and substrate 10 in a direction perpendicular to a surface of substrate 10 on which unpatterned first adhesive layer 20 and first component 31 are disposed.

As shown in FIG. 4D, first component 31 comprises connection posts 34 that are in contact with first contact pads 12 as a consequence of micro-transfer printing first component 31 to first adhesive layer 20. In certain embodiments, connection post 34 has a height that is greater than its base width, a base width that is greater than its peak width, or a base area that is greater than its peak area. Connection post 34 can have a sharp point. Referring to FIG. 4E, first component 31 comprises connection posts 34 that are not in contact, but are aligned, with first contact pads 12 as a consequence of micro-transfer printing first component 31 to first adhesive layer 20.

Referring to FIG. 4F, first adhesive layer 20 is cured, for example by heat, to adhere first component 31 to substrate 10 in step 141. When heated, first adhesive layer 20 first reflows and coats any combination of first contact pads 12, substrate 10, first and second wires 17, 18 disposed on substrate 10, connection posts 34, and first component 31 and then shrinks and hardens forming a cured first adhesive layer 21, pulling first component 31 closer to substrate 10 and forcing connection posts 34 into firm contact with first contact pads 12, for example each connection post 34 is in contact with, extends into (e.g., pierces), or extends through first contact pad 12 on substrate 10 to electrically connect first contact pad 12 to connection posts 34 and micro-transfer printed first component 31.

Referring to FIG. 4G, in step 151 exposed portions 28 of cured first adhesive layer 21 (shown in FIG. 4F) are removed, for example by etching. Since some portions of cured first adhesive layer 21 are between first component 31 and substrate 10, those portions of cured first adhesive layer 21 are not exposed and are substantially protected from the removal process, so that exposed portions 28 of cured first adhesive layer 21 are removed, in particular exposed portions 28 of cured first adhesive layer 21 over second contact pads 13, but portions of cured first adhesive layer 21 between first component 31 and substrate 10 that are not exposed remain substantially in place to continue adhering first component 31 to substrate 10.

Referring to FIG. 4H, in step 161 first component 31 is tested to determine if first component 31 is a faulty first component 31F. (As used herein, faulty components in the figures are indicated with an X.) If it is not a faulty first component 31F, the process terminates in step 199. However, according to some embodiments of the present invention, at least sometimes a first component 31 that is micro-transfer printed to first adhesive layer 20 and substrate 10 and electrically connected to first contact pads 12, will fail for any one of a variety of reasons, including, for example, an improperly constructed first component 31 (e.g., step 111), a faulty micro-transfer printing process (e.g., step 131), or a faulty electrical connection between connection post 34 and first contact pad 12 (e.g., step 131). In such a case, if first component 31 is a faulty first component 31F, a second (e.g., unpatterned) adhesive layer 22 is disposed over and in contact with at least a second portion 13P of substrate 10 different from the first portion 12P, wherein the second portion 13P is adjacent to or on second contact pad 13 in step 171 as shown in FIG. 4I and second component 32 is micro-transfer printed to substrate 10 in step 181 so that (i) second component 32 is in alignment with second contact pad 13 and (ii) second adhesive layer 22 contacts at least a portion of second component 32 between second component 32 and substrate 10, as shown in FIG. 4J so that connection posts 34 of second component 32 are in contact with or above second contact pads 13. This process can be substantially the same as that for first adhesive layer 20 and first component 31.

Referring to FIG. 4K in step 191, unpatterned second adhesive layer 22 is cured to harden and shrink to form unpatterned cured second adhesive layer 23 as with first adhesive layer 20 so that connection posts 34 of second component 32 are in firm contact with second contact pads 13. Exposed portions 29 of unpatterned second adhesive layer 22 (shown in FIG. 4K) are optionally removed in step 192 as shown in FIG. 4L. In optional step 198 and as shown in FIG. 4M, first wire 17 is cut, forming cut first wire 19. Second component 32 can then operate in place of faulty first component 31F and faulty first component 31F is electrically removed from the repaired electrical connection structure 99. For example, in a case in which faulty first component 31F experiences an electrical short between power and ground signals, electrical power waste is prevented by cutting first wire 17, for example a power or ground line, or both. In some embodiments, signal wires can be cut, or any combination of input or output wires connected to faulty first component 31F.

Figure 5:
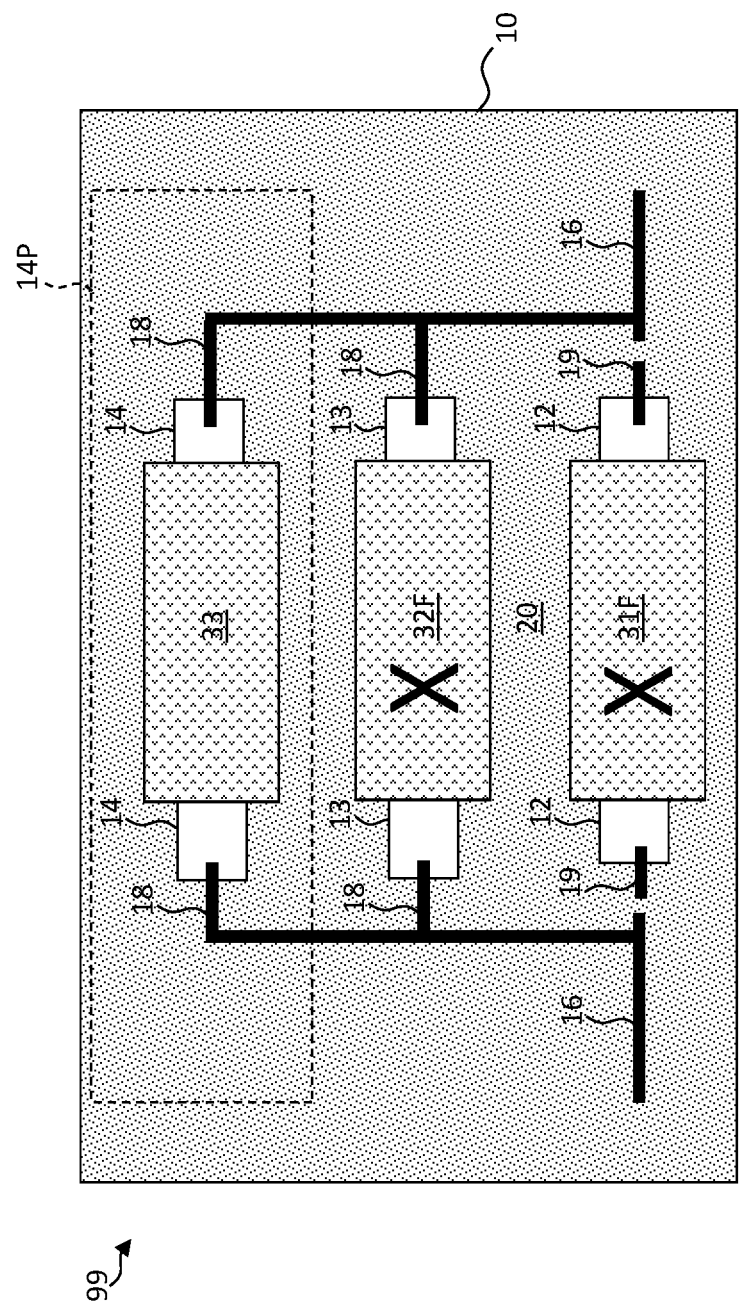
FIG. 5 is a plan view of a structure, according to illustrative methods of the present invention.

Referring to FIG. 5 and the flow diagram of FIG. 1, methods according to certain embodiments of the present invention include providing a third contact pad 14 and disposing a third component 33. In some such methods, one or more component source wafers 60 comprise a third component 33 substantially functionally identical to first and second components 31, 32. Substrate 10 is provided with a third contact pad 14 electrically connected in parallel with first and second contact pads 12, 13. Second component 32 is tested to determine if second component 32 is a faulty second component 32F. If second component 32 is a faulty second component 32F (indicated with an X), a third adhesive layer is disposed over and in contact with at least a third portion 14P of substrate 10 different from the first and second portions 12P, 13P, wherein the third portion 14P is adjacent to or on third contact pad 14 and third component 33 is micro-transfer printed onto the third adhesive layer so that (i) third component 33 is in alignment with third contact pad 14 and (ii) the third adhesive layer contacts at least a portion of third component 33 between third component 33 and substrate 10. The process is similar to the process for first and second components 31, 32. As noted with respect to FIG. 1, the process of testing a micro-transfer printed component 30, coating an additional adhesive layer, micro-transfer printing another component 30, and curing the additional adhesive layer can be repeated as many times for as many parallel-connected contact pads as are provided on substrate 10 to provide a completely repaired electrical connection structure 99.

As used herein, in "alignment" means that a component 30 (e.g., first, second, or third component 31, 32, 33) is positioned with respect to a contact pad (e.g., first, second, or third contact pad 12, 13, 14) so that an electrical connection is readily formed between the component 30 and the contact pad without interference or routing complications from other components 30 or contact pads. For example, in some embodiments first, second, or third components 31, 32, 33 can be positioned directly above first, second, or third contact pads 12, 13, 14, respectively, in a direction perpendicular to a surface of substrate 10 or an adhesive layer on which first, second, or third components 31, 32, 33 are disposed, e.g., a vertical direction, so that any connection posts 34 are disposed above or in contact with respective first, second, or third contact pads 12, 13, 14. In some embodiments, in "alignment" means that first, second, or third components 31, 32, 33 are positioned with respect to first, second, or third contact pads 12, 13, 14 so that first, second, or third components 31, 32, 33 are positioned laterally adjacent or next to first contact pad 12 or between first, second, or third contact pads 12, 13, 14 respectively, in a direction parallel to a surface of substrate 10 or an adhesive layer on which first, second, or third components 31, 32, 33 are disposed, e.g., in a horizontal direction. By adjacent is meant that no other contact pad or component 30 is between the adjacent contact pad and component 30 and lateral is in a horizontal direction parallel to a surface of the substrate on which components 30 and contact pads are disposed. An adjacent component 30 or contact pad can be within a distance less than or equal to a lateral dimension of the component 30 or contact pad, a distance less than or equal to twice a lateral dimension of the component 30 or contact pad, or a distance less than or equal to four times a lateral dimension of the component 30 or contact pad.

According to some embodiments of the present invention, functionally identical components 30 (e.g., first, second, and third components 31, 32, 33) operate substantially the same when provided with the same input signals. As is well known, all manufacturing processes have some variation and some variation in operation of components 30 can be expected as a result of natural variation. Components 30 are considered functionally identical if they are intended to operate the same under the same operating conditions (e.g., within manufacturing tolerances). Components 30 can be, but are not necessarily, substantially identical. Substantially identical components 30 are made in the same materials with the same circuits, construction processes, and in the same type of package or die (e.g., and with the same size). However, substantially identical components 30 can also vary somewhat due to manufacturing variations. As used herein, substantially identical components 30 are those components 30 designed to be and operate the same but can differ slightly in structure and performance due to inherent manufacturing variability.

In some embodiments of the present invention, more than one, for example two, three, four, five, or more of each of first, second, and third contact pads 12, 13, 14 are provided on substrate 10, for example two as shown in FIG. 4A-4N. Likewise, more than two wires 16 can be provided on substrate 10. Wires 16 and contact pads (e.g., first and second contact pads 12, 13) can be constructed using photolithographic methods and materials, for example metal, such as aluminum, gold, or silver, deposited by evaporation and patterned using pattern-wise exposed, cured, and etched photoresists.

Substrate 10 can be a destination substrate such as a display substrate, or any other suitable substrate 10, having a surface suitable for photolithography and, in some embodiments, micro-transfer printing, for example glass, plastic, ceramic, semiconductor, quartz, or sapphire. Substrate 10 can be a printed circuit board and can comprise polymer, resin, or fiber glass.

Component source wafers 60 can comprise a semiconductor, such as silicon, or a compound semiconductor, such GaN or GaAs, in a crystalline, or non-crystalline form, in which components 30 can be constructed (e.g., as shown in FIGS. 10A, 10B and as discussed further below). Typically, component source wafers 60 are smaller than substrates 10. Components 30 formed or disposed in or on component source wafers 60 are constructed using integrated circuit and photolithographic methods. Components 30 can be any of a wide variety of active or passive (or passive and active) electrical or electro-optic components or devices, for example electronic circuits (such as CMOS circuits), light-emitting diodes, or sensors. Components 30 can be unpackaged dice (each an unpackaged die) transferred directly from component source wafers 60 on or in which components 30 are constructed to substrate 10.

First and second adhesive layers 20, 22 can be any suitable adhesive layer, for example resin layers, such as SU-8, a commonly used epoxy-based photoresist used in photolithographic methods and materials, or other suitable adhesive layers. In some embodiments, first and second adhesive layers 20, 22 can be patterned or deposited in a pattern. In some embodiments, first and second adhesive layers 20, 22 are not or cannot be deposited in a pattern. As used herein, the term 'resin' can refer to an adhesive and the terms 'resin' or 'adhesive' can be used interchangeably to refer to an entire layer of resin or adhesive, or only a portion of such a layer. A layer can be a patterned layer that extends over only a portion of substrate 10. Unpatterned adhesive layers can be disposed on or over substrate 10 and first and second contacts 12, 13 using methods known in the art, such as drop coating, spin coating, curtain coating, or hopper coating. Patterned adhesive layers can be disposed on or over substrate 10 and first and second contacts 12, 13 using methods and equipment such as inkjet printing or screen printing or laser transfer from a source donor adhesive sheet.

Second adhesive layer 22 can be disposed using the same methods and/or materials as first adhesive layer 20 or can be disposed using different methods and/or materials as first adhesive layer 20. First and second adhesive layers 20, 22 can each separately be a curable adhesive, such as a thermally curable adhesive or radiation-curable adhesives (e.g., cured by ultra-violet-radiation). In some embodiments of the present invention, a first adhesive layer 20 is cured at a higher temperature than a second adhesive layer 22. In some embodiments of the present invention, first adhesive layer 20 is thermally cured and second adhesive layer 22 is radiation cured, or vice versa. By providing first and second adhesive layers 20, 22, that comprise different materials or use different curing processes, the adhesion of components 30 that are adhered with different materials or processes can be selectively controlled. For example, curing second adhesive layer 22 does not necessarily affect the adhesion of cured first adhesive layer 21. In some embodiments, a first adhesive layer 20 is contact with a second adhesive layer 22. In some embodiments, a first adhesive layer 20 is spatially separate (e.g., not in contact with) a second adhesive layer 22. For example, a patterned first adhesive layer 20 and a patterned second adhesive layer 22 can be spatially separate due to their respective patterning.

Micro-transfer printing processes suitable for disposing components 30 onto substrates 10 are described in *Inorganic light-emitting diode displays using micro-transfer printing* (Journal of the Society for Information Display, 2017, DOI # 10.1002/jsid.610, 1071-0922/17/2510-0610, pages 589-609), U.S. Pat. No. 8,722,458 entitled Optical Systems Fabricated by Printing-Based Assembly, U.S. patent application Ser. No. 15/461,703 entitled Pressure Activated Electrical Interconnection by Micro-Transfer Printing, U.S. Pat. No. 8,889,485 entitled Methods for Surface Attachment of Flipped Active Components, U.S. patent application Ser. No. 14/822,864 entitled Chiplets with Connection Posts, U.S. patent application Ser. No. 14/743,788 entitled Micro-Assembled LED Displays and Lighting Elements, and U.S. patent application Ser. No. 15/373,865, entitled Micro-Transfer Printable LED Component referenced above and the disclosure of each of which is incorporated herein by reference in its entirety.

Components 30 according to certain embodiments of the present invention can be tested electronically or optically or by a test circuit 90 (shown in FIG. 4H) that uses one or both of electronics and optics. In some embodiments of the present invention, first components 31 are tested by electrically connecting first wires 17, for example through wires 16, to electrical test equipment to electrically stimulate first components 31 and measure the response of first components 31. In some embodiments, first components 31 respond to electrical stimulation optically, for example by emitting light. Optical sensors and systems can receive and measure the emitted light and the measurements used to determine if first component 31 and its electrical connections are operating properly. If they are not operating properly, first component 31 is deemed to be a faulty first component 31F (even if the actual fault is in the electrical connection to first component 31 or first wires 17). A faulty first component 31F is also a failed first component 31F. Second components 32 can be similarly tested.

Figure 3A:
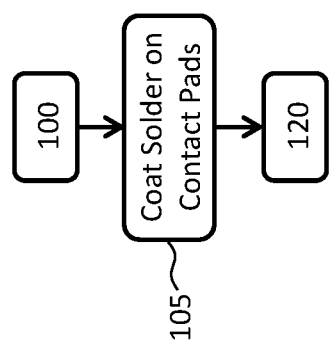
FIGS. 3A and 3B are flow diagrams of methods according to illustrative embodiments of the present invention.
Figure 3B:
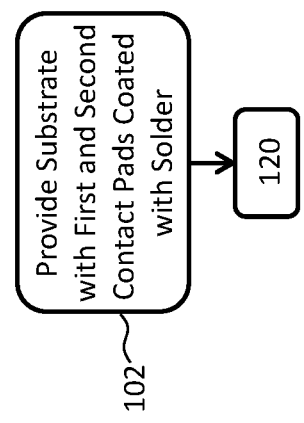
Figure 6A:
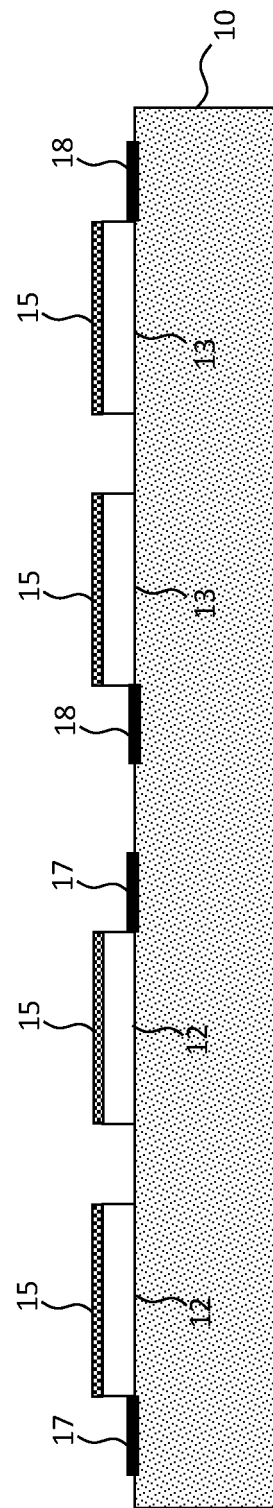
FIGS. 6A-6C are successive cross sections of structures formed during a method, according to illustrative embodiments of the present invention.

Referring to FIGS. 3A, 3B, and 6A-6C, in some embodiments of the present invention, solder 15 is disposed on contact pads (e.g., first and second contact pads 12, 13) of substrate 10 in step 105 (as shown in FIGS. 3A, 6A). Solder 15 can also be provided on connection posts 34. In some embodiments, substrate 10 is provided with solder-coated contact pads (e.g., first and second contact pads 12, 13) of substrate 10 in step 101 (as shown in FIGS. 3B, 6A). Solder 15 can be softer than a material in first or second contact pads 12, 13 or in connection post(s) 34 and connection post(s) 34 can have a different hardness than first or second contact pads 12, 13. Printed circuit board soldering techniques and materials can be used to provide solder 15 on first or second contact pads 12, 13, for example. For example, solder 15 can be a tin alloy. By providing solder 15 with a desired melting temperature, the electrical connection between first or second contact pads 12, 13 and connection post 34 can be enhanced by flowing solder 15 so that solder 15 wicks along surfaces of first or second contact pads 12, 13 and connection post(s) 34.

Figure 6B:
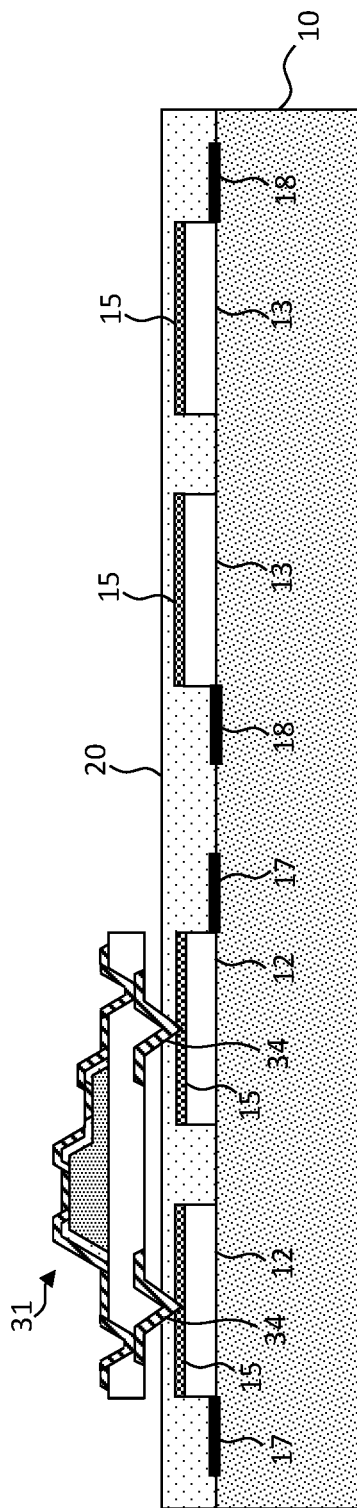
Figure 6C:
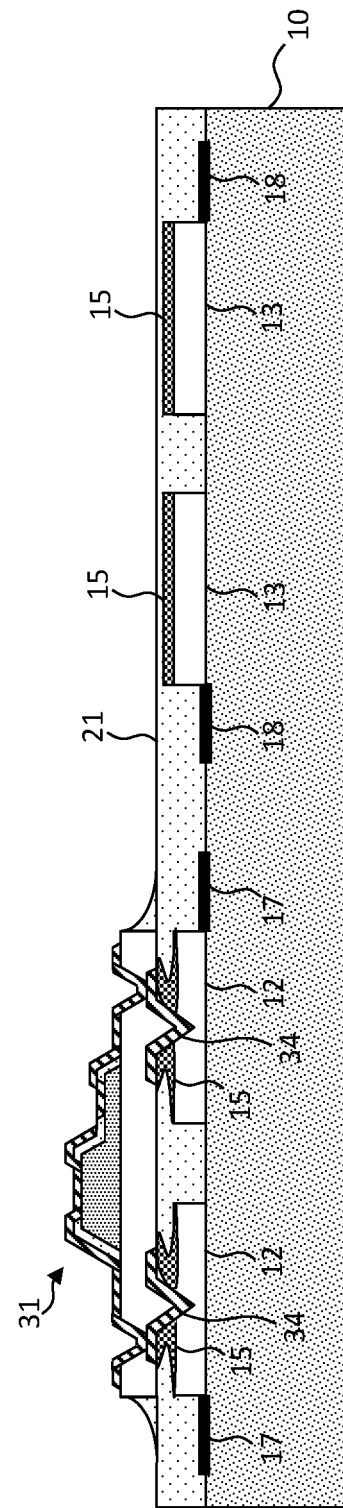

Referring to FIGS. 6A, 6B, and 6C, solder 15 on the contact pads can facilitate electrical connections between connection posts 34 and first and second contact pads 12, 13. As shown in FIG. 6B, a component 30 (e.g., first component 31) is micro-transfer printed to first adhesive layer 20 and connection posts 34 contact first adhesive layer 20. In various embodiments, first component 31 can be micro-transfer printed so that connection posts 34 contact first adhesive layer 20 but not solder 15 or first contact pads 12, so that connection posts 34 contact first adhesive layer 20 and solder 15 but not first contact pads 12 (shown in FIG. 6B), or so that connection posts 34 contact first adhesive layer 20, solder 15, and first contact pads 12. In any of these cases, solder 15 is heated to a melting temperature of solder 15, causing solder 15 to flow into electrical contact with connection post 34 and first contact pads 12.

In some embodiments of the present invention, solder 15 is heated to a melting temperature that also causes first adhesive layer 20 to reflow. Thus, solder 15 can flow over first contact pads 12 and connection posts 34, improving electrical contact between connection posts 34 and first contact pads 12. Solder 15 can also be heated to a melting temperature that causes first adhesive layer 20 to cure. Thus, solder 15 can initially flow over first contact pads 12 and connection posts 34 as first adhesive layer 20 reflows and then solder 15 becomes encapsulated by cured first adhesive layer 21 (shown in FIG. 6C).

In some embodiments solder 15 is heated to a melting temperature before first adhesive layer 20 is cured. In some embodiments of the present invention, first adhesive layer 20 comprises a thermally curable resin that cures at a cure temperature greater than or equal to a solder 15 melting temperature. First adhesive layer 20 and solder 15 can be heated in a common step. In some embodiments of the present invention, first adhesive layer 20 comprises a radiation-curable resin and first adhesive layer 20 is cured with radiation at a temperature greater than or equal to a solder 15 melting temperature. As noted above, according to some embodiments of the present invention, the use of different materials or processes for curing adhesive layers enables independent and selective control of the different adhesive layers, for example first adhesive layer 20 and second adhesive layer 22. Thus, heating second adhesive layer 22 to a cure temperature that is lower than a cure temperature of first adhesive layer 20 prevents first adhesive layer 20 from reflowing and disturbing the adhesion between first component 31 and substrate 10 or the encapsulation of solder 15. Similarly, using radiation, such as ultra-violet radiation, to cure second adhesive layer 22 prevents first adhesive layer 20 from reflowing and disturbing the adhesion between first component 31 and substrate 10 or the encapsulation of solder 15. In some embodiments of the present invention, an adhesive layer (e.g., either first or second adhesive layers 20, 22) is cured with radiation at a temperature equal to or greater than a melting temperature of solder 15, thus enabling solder 15 to flow over contact pads (e.g., first or second contact pads 12, 13, or both) and connection posts 34 as the adhesive layer cures and encapsulates solder 15, improving electrical contact between connection posts 34 and first or second contact pads 12, 13, or both.

Figure 7:
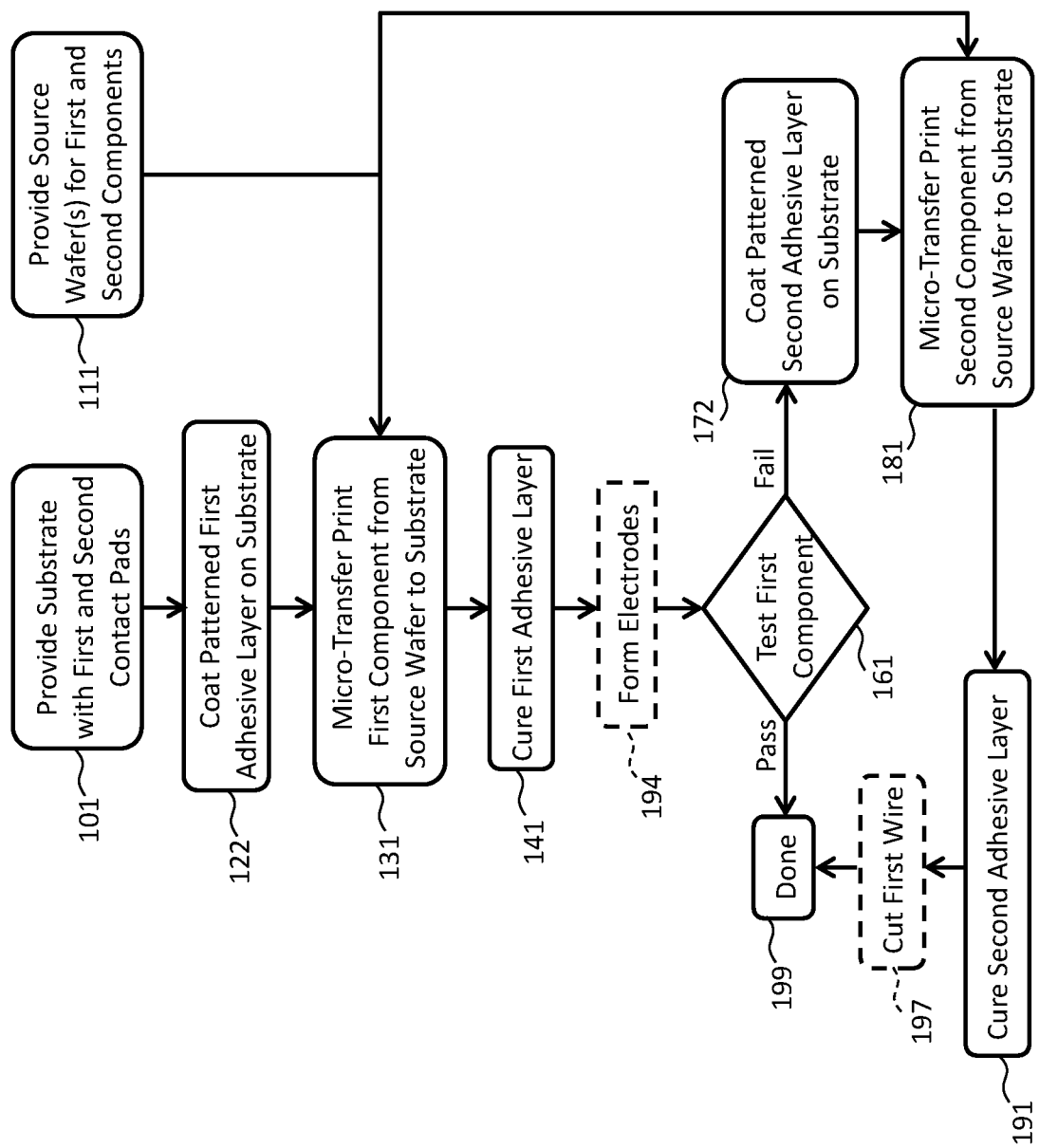
FIG. 7 is a flow diagram of a method, according to illustrative embodiments of the present invention.
Figure 8A:
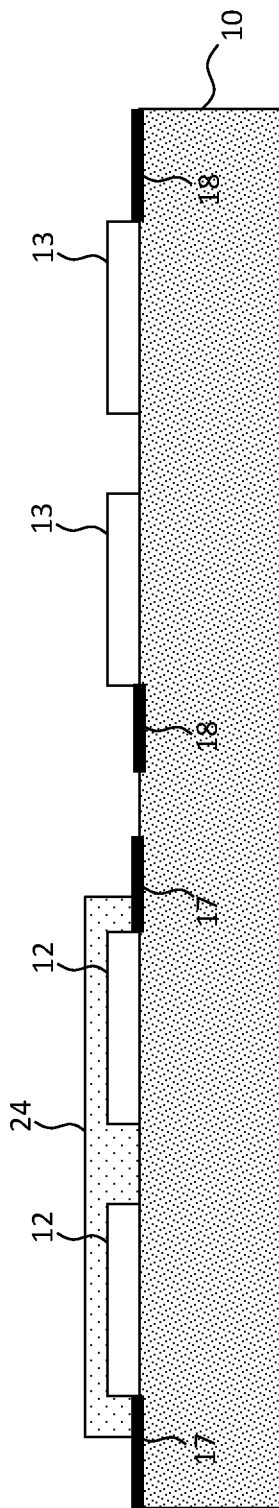
Figure 8B:
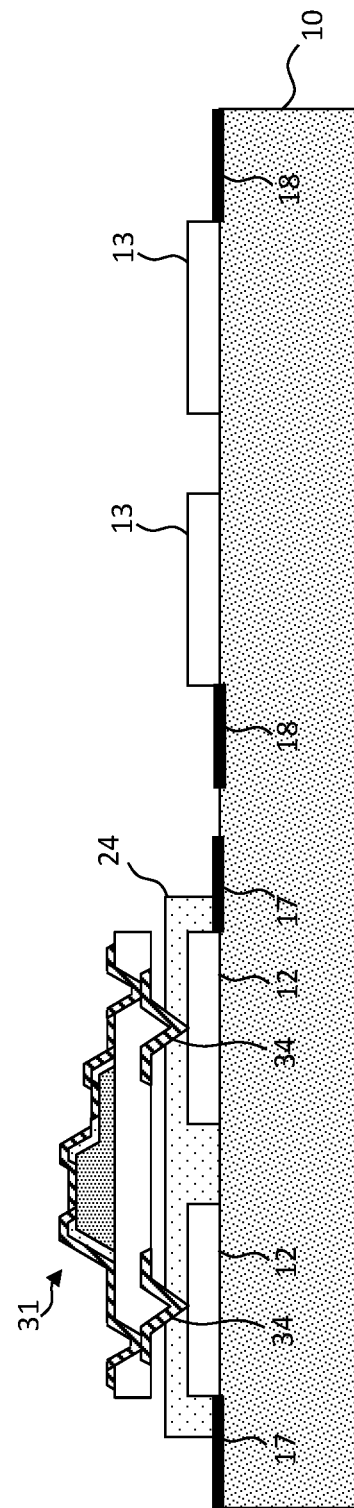

As illustrated in FIGS. 2 and 4A-4N, first or second adhesive layers 20, 22, or both can be coated or otherwise disposed as an unpatterned blanket deposition over substrate 10. According to some embodiments of the present invention and as illustrated in FIGS. 7 and 8A-8H, patterned first or second adhesive layers 24, 26, or both can be coated or otherwise disposed as a patterned deposition over substrate 10, for example using an inkjet printer, screen printer, laser transfer, selective transfer, or other patterned deposition methods and devices. Referring to FIG. 7 and FIG. 8A, a method of making a repaired electrical connection structure 99 comprises steps 101 and 111 as discussed above with respect to FIGS. 2, 4A, and 4B. Referring to FIG. 8A, in step 122 a patterned first adhesive layer 24 is disposed, for example by inkjet printing, over and in contact with at least a portion of substrate 10 or adjacent to or on at least a portion of first contact pad 12. In step 131 and as shown in FIG. 8B, first component 31 is micro-transfer printed onto the patterned first adhesive layer 24 so that (i) first component 31 is in alignment with first contact pad 12 and (ii) first patterned adhesive layer 24 contacts at least a portion of first component 31 between first component 31 and substrate 10. As shown in FIG. 8B, first component 31 comprises connection posts 34 that are in contact with first contact pads 12 (or above first contact pads 12, as shown in FIG. 4E) as a consequence of micro-transfer printing first component 31 to patterned first adhesive layer 24. Referring to FIG. 8C, first patterned adhesive layer 24 is cured, for example by heat, to adhere first component 31 to substrate 10 in step 141. When heated, patterned first adhesive layer 24 first reflows and coats any combination of first contact pads 12, substrate 10, first and second wires 17, 18 disposed on substrate 10, connection posts 34, and first component 31 and then shrinks and hardens forming a cured patterned first adhesive layer 25, pulling first component 31 closer to substrate 10 and forcing connection posts 34 into firm contact with first contact pads 12.

Figure 8E:
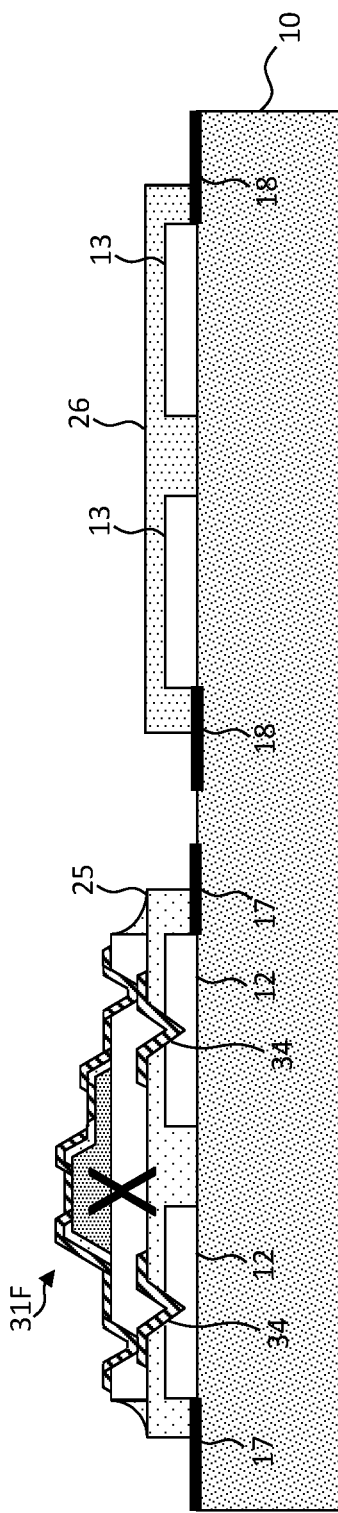
Figure 8F:
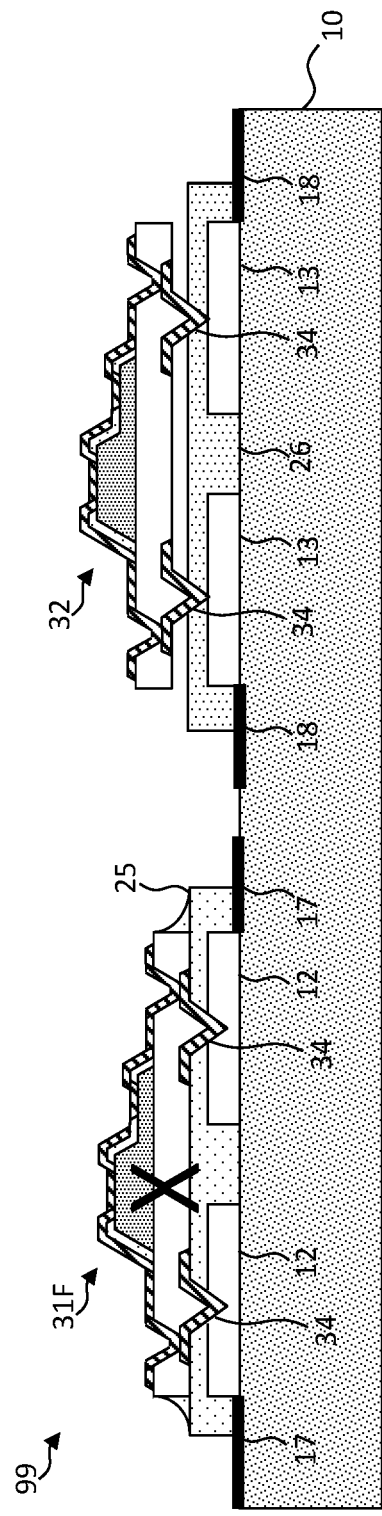
Figure 9C:
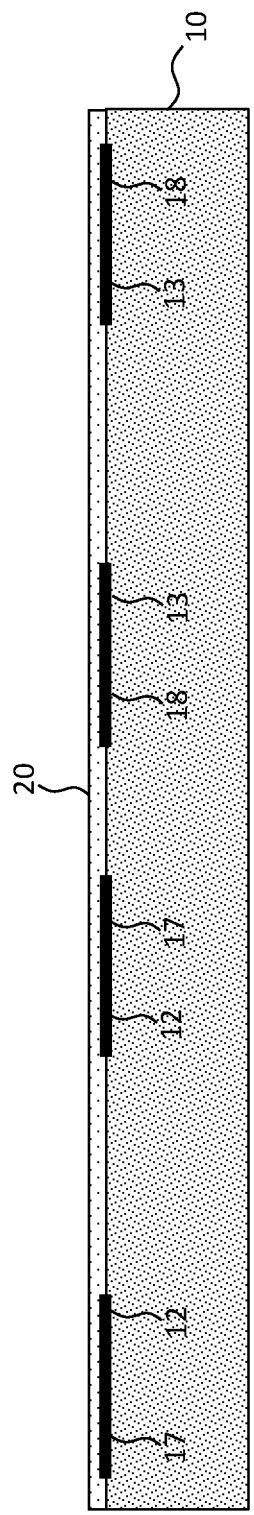
Figure 9D:
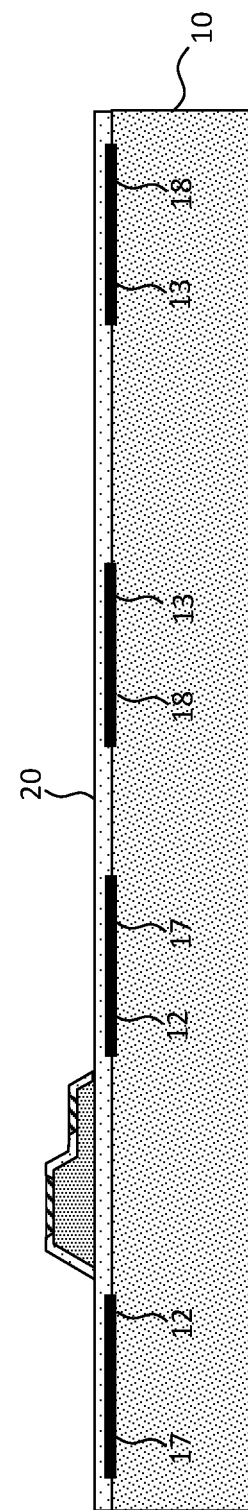
Figure 9J:
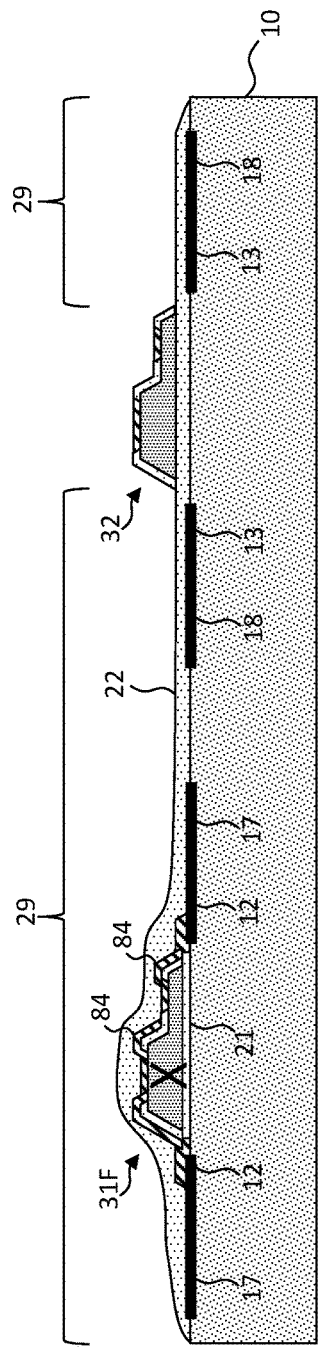
Figure 9K:
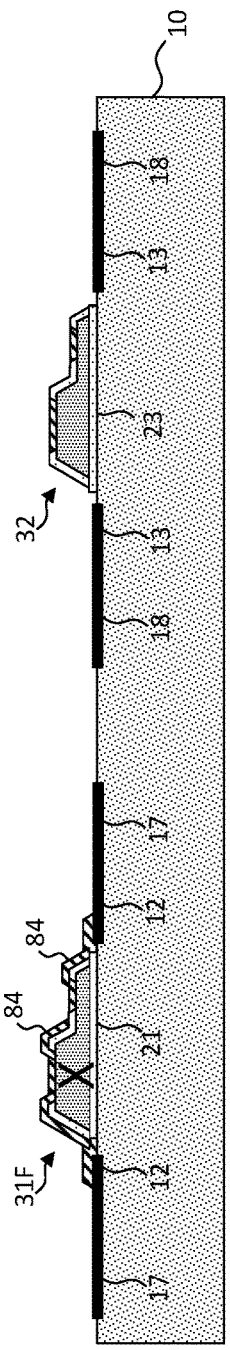

Referring to FIG. 8D, in step 161 first component 31 is tested to determine if first component 31 is a faulty first component 31F. If it is not a faulty first component 31F, the process terminates in step 199. However, according to some embodiments of the present invention, at least sometimes a first component 31 that is micro-transfer printed to patterned first adhesive layer 24 and substrate 10 and electrically connected to contact pads 12, will fail for any one of a variety of reasons, including, for example, an improperly constructed first component 31 (step 111), a faulty micro-transfer printing process (step 131), or a faulty electrical connection between connection post 34 and first contact pad 12 (step 131). In such a case, if first component 31 is a faulty first component 31F, a patterned second adhesive layer 26 is disposed over and in contact with substrate 10 or adjacent to or on at least a portion of second contact pad 13 in step 172 as shown in FIG. 8E and second component 32 is micro-transfer printed to substrate 10 in step 181 so that (i) second component 32 is in alignment with second contact pad 13 and (ii) patterned second adhesive layer 26 contacts at least a portion of second component 32 between second component 32 and substrate 10, as shown in FIG. 8F so that connection posts 34 of second component 32 are in contact with or above second contact pads 13. Referring to FIG. 8G in step 191, patterned second adhesive layer 26 is cured to harden and shrink as with first patterned adhesive layer 24 so that connection posts 34 of second component 32 are in firm contact with second contact pads 13. In step 197 and as shown in FIG. 8H, first wire 17 is cut, forming cut first wire 19. Second component 32 can then operate in place of faulty first component 31F and faulty first component 31F is electrically removed from the repaired electrical connection structure 99.

The exemplary embodiments illustrated in FIGS. 4A-4N and 8A-8H both comprise connection posts 34 to make electrical connections between components 30 and first, second, and third contact pads 12, 13, 14. In some embodiments of the present invention, components 30 are, instead, electrically connected using photolithographically defined first and second electrodes 84, 85 as shown in FIGS. 9A-9M. Photolithographically defined first and second electrodes 84, 85 can be utilized with either of the exemplary embodiments illustrated in FIGS. 4A-4N (with unpatterned first and second adhesive layer 20, 22) or FIGS. 8A-8H (with patterned first and second adhesive layer 24, 26). FIGS. 9A-9M illustrate methods and structures comprising unpatterned first and second adhesive layers 20, 22 (as described in the FIG. 2 flow diagram) but can be equally well employed with patterned first and second adhesive layers 24, 26 (e.g., as described in the FIG. 7 flow diagram).

Referring to FIGS. 9A-9M and again to FIG. 2, in exemplary embodiments of the present invention employing an unpatterned deposition of resin over substrate 10, a method of making a repaired electrical connection structure 99 comprises providing in step 101 a substrate 10 comprising a first contact pad 12 electrically connected to first wires 17 and a second contact pad 13 electrically connected to second wires 18 in parallel with first contact pad 12 and first wires 17. (See FIG. 9A in cross section and FIG. 9B in plan view. For clarity of illustration, the FIG. 9A cross section depicts first and second contact pads 12, 13 in a row, rather than in the more practical two-dimensional array of FIG. 9B.) Substrate 10 can comprise multiple first and second contact pads 12, 13, wires 16, and first and second wires 17, 18, as shown in FIG. 9A. First contact pads 12 can be spaced apart to provide space for components 30 between first contact pads 12 over substrate 10. Likewise, second contact pads 13 can be spaced apart to provide space for components 30 between second contact pads 13 over substrate 10. In contrast, contact pads for components 30 comprising connection posts 34 are generally spaced more closely together so that connection posts 34 can intersect the contact pads when components 30 are micro-transfer printed.

One or more component source wafers 60 (e.g., as shown in FIGS. 10A, 10B) comprising a first component 31 and a second component 32 are provided in step 111. Second component 32 is substantially functionally identical to first component 31.

Referring to FIG. 9C, in step 121 an unpatterned first adhesive layer 20 is disposed, for example by drop, spin, or curtain coating, over and in contact with at least a portion of substrate 10 or adjacent to or on at least a portion of first contact pad 12. In step 131 and as shown in FIG. 9D, first component 31 is micro-transfer printed onto first adhesive layer 20 so that (i) first component 31 is in alignment with first contact pad 12 and (ii) first adhesive layer 20 contacts at least a portion of first component 31 between first component 31 and substrate 10. In some embodiments, first component 31 is disposed on substrate 10 between first contact pads 12 or laterally adjacent to first contact pad 12 but not necessarily on or over first contact pads 12 (unlike embodiments using connection posts 34). Referring to FIG. 9E, first adhesive layer 20 is cured, for example by heat, to adhere first component 31 to substrate 10 in step 141 and form a cured first adhesive layer 21. Referring to FIG. 9F, in step 151 exposed portions 28 of cured first adhesive layer 21 (shown in FIG. 9E) are removed, for example by etching. Since some portions of cured first adhesive layer 21 are between first component 31 and substrate 10, those portions of cured first adhesive layer 21 are not exposed and are substantially protected from the removal process, so that exposed portions 28 of cured first adhesive layer 21 are removed, in particular exposed portions 28 of cured first adhesive layer 21 over second contact pads 13, but portions of cured first adhesive layer 21 between first component 31 and substrate 10 that are not exposed remain substantially in place to continue adhering first component 31 to substrate 10.

Referring to FIG. 9G, in step 194, first electrodes 84 are formed over first component 31, substrate 10, and first contact pads 12 to electrically connect first component 31 to first contact pads 12. First electrodes 84 can comprise patterned metal wires 16 and can be formed using photolithographic processes, including evaporative deposition of metal and patterning using photoresist masks, as is known in the art.

Referring to FIG. 9H, in step 161 first component 31 is tested to determine if first component 31 is a faulty first component 31F. If it is not a faulty component, the process terminates. However, according to some embodiments of the present invention, at least sometimes a first component 31 that is micro-transfer printed to first adhesive layer 20 and substrate 10 and electrically connected to first contact pads 12, will fail for any one of a variety of reasons, including, for example, an improperly constructed first component 31 (step 111), a faulty micro-transfer printing process (step 131), or a faulty electrical connection between connection post 34 and first contact pad 12 (step 131). In such a case, if first component 31 is a faulty first component 31F, a second adhesive layer 22 is disposed over and in contact with substrate 10 or adjacent to, over, or on at least a portion of second contact pad 13 in step 171 as shown in FIG. 9I and second component 32 is micro-transfer printed to substrate 10 in step 181 so that (i) second component 32 is in alignment with second contact pad 13 and (ii) second adhesive layer 22 contacts at least a portion of second component 32 between second component 32 and substrate 10, as shown in FIG. 9J. In some embodiments, second component 32 is disposed on substrate 10 between second contact pads 13 or laterally adjacent to second contact pad 13 but not necessarily on or over second contact pads 13 (unlike embodiments using connection posts 34). In step 191, second adhesive layer 22 is cured to harden and shrink forming cured second adhesive layer 23 as with first adhesive layer 20 and the exposed portions 29 of cured second adhesive layer 23 are optionally removed in step 192 as shown in FIG. 9K.

Figure 9L:
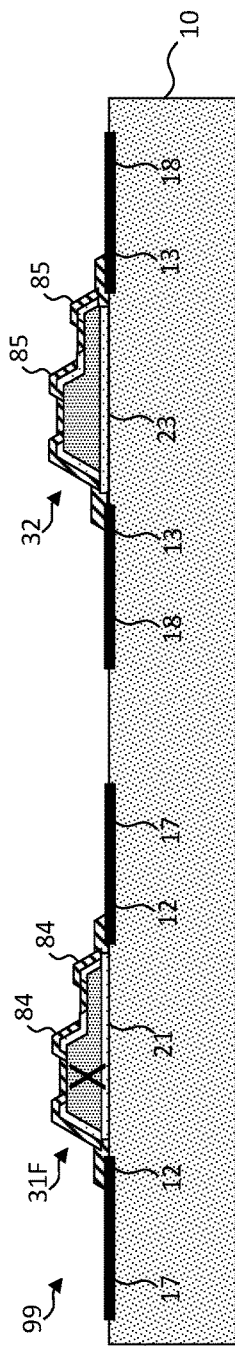
Figure 10A:
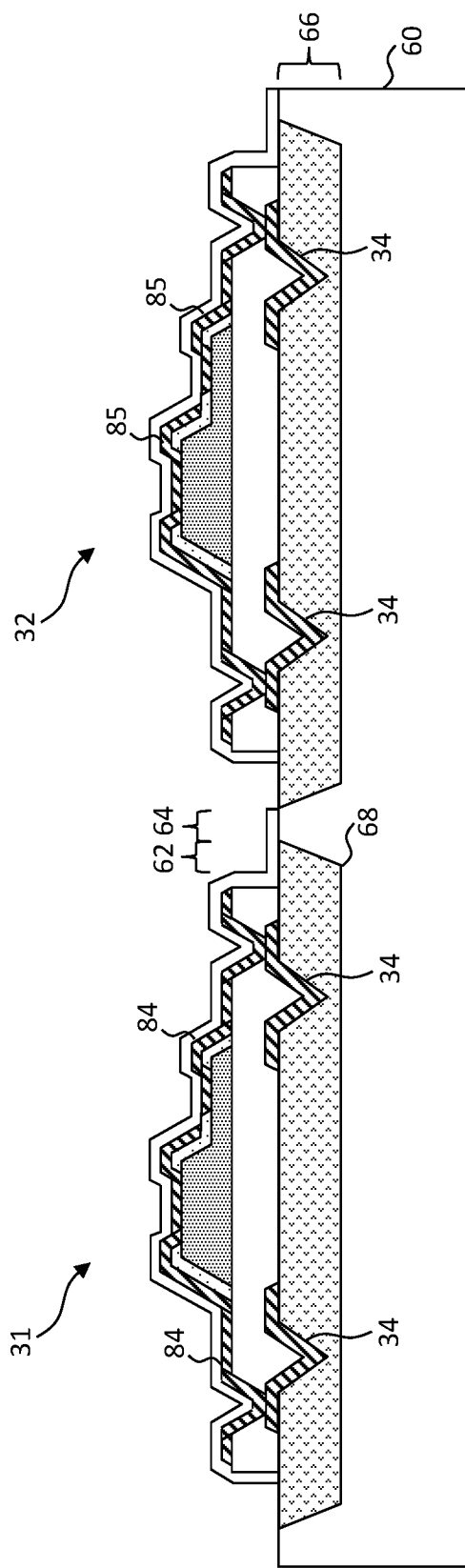
FIGS. 10A and 10B are cross sections of components on a source wafer, according to illustrative embodiments of the present invention.
Figure 10B:
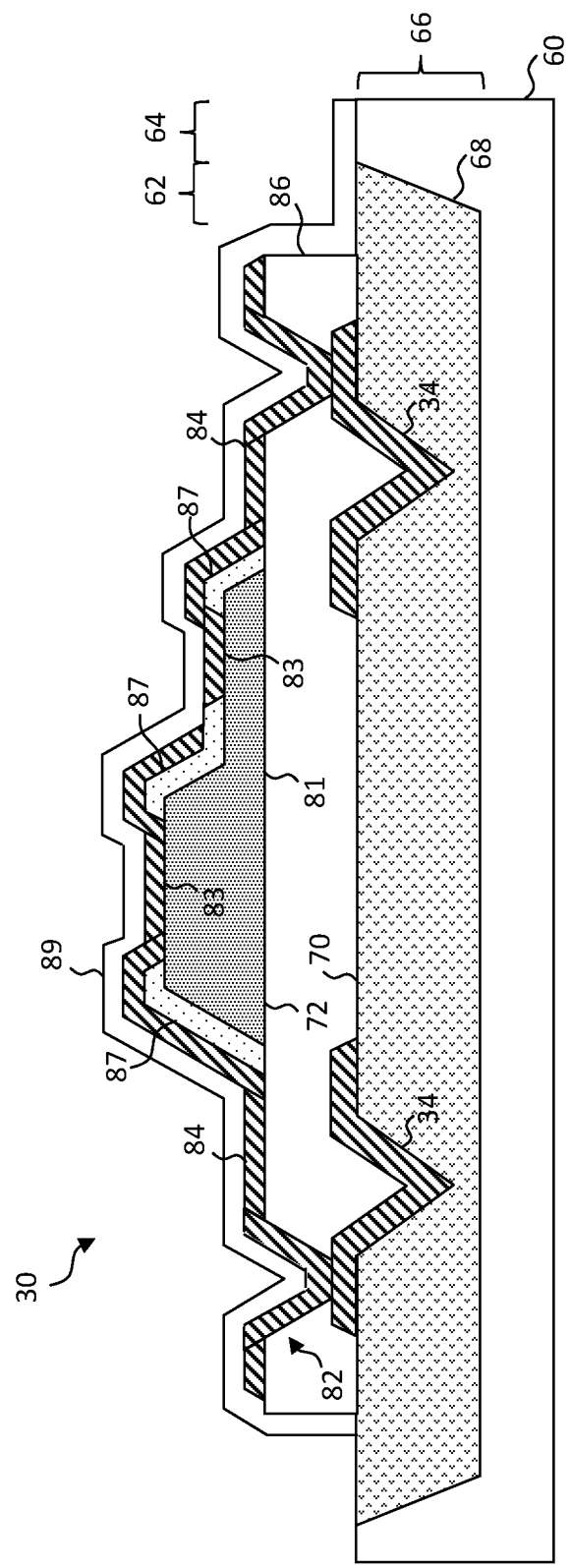

Referring to FIG. 9L, in step 195, second electrodes 85 are formed over second component 32, substrate 10, and second contact pads 13 to electrically connect second component 32 to second contact pads 13. Second electrodes 85 can comprise patterned metal wires and can be formed using photolithographic processes, including evaporative deposition of metal and patterning using photoresist masks, as is known in the art.

Figure 9M:
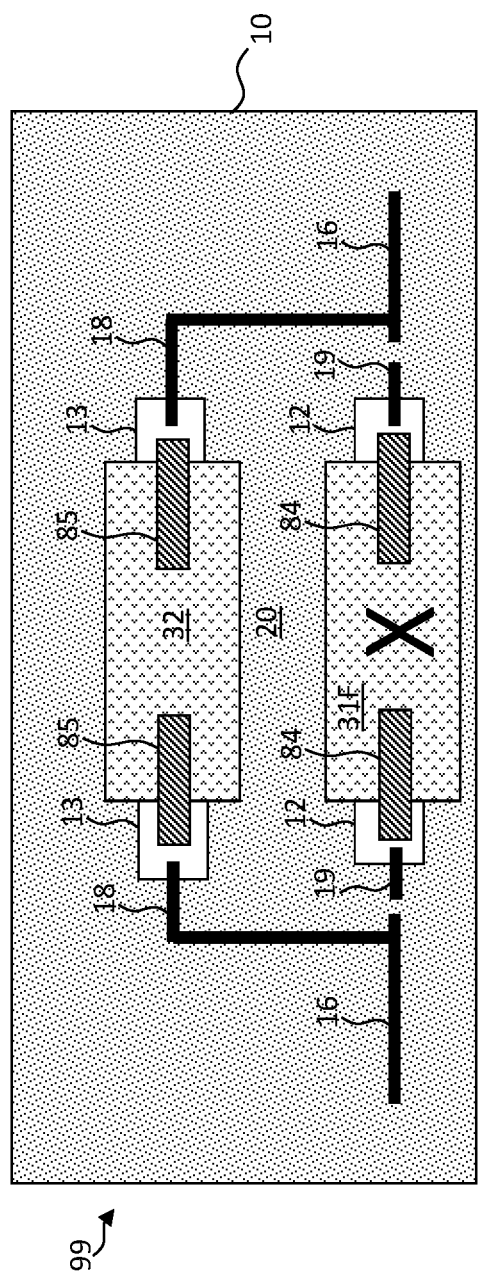

In step 197 and as shown in the FIG. 9M plan view, first wire 17 is cut, forming cut first wire 19. Second component 32 can then operate in place of faulty first component 31F and faulty first component 31F is electrically removed from the repaired electrical connection structure 99. The structure illustrated in FIG. 9M has been constructed and operationally demonstrated with compound components 30 comprising three LEDs 81 emitting different colors of light together with control circuits for the LEDs 81 providing a component 30 that is an active-matrix display pixel on a display substrate 10.

Certain embodiments of the present invention are enabled by micro-transfer printing components 30 from one or more component source wafers 60 to substrate 10 using a transfer device (e.g., stamp, such as an elastomeric stamp) having a plurality of pillars or posts that each contact a component 30 so that multiple components 30 can be transferred in one micro-transfer printing step. Referring to FIG. 10A and the detail cross section of a single component 30 in FIG. 10B, one or more components source wafers 60 can each have a plurality of micro-transfer printable components 30 formed or disposed thereon. In this illustrative and non-limiting example, component 30 can be and is referred to as a light-emitting diode (LED) 81. In certain embodiments, one or more source wafers 60 comprise components 30 that are not LEDs 81. Components 30 can be any useful component, including any combination of active or passive, or active and passive, electronic or opto-electronic devices or integrated or discrete circuits or circuit elements and collectively refers herein to any of first, second, or third components 31, 32, 33. (It is understood that the use of "first," "second," and "third" is arbitrary.) The examples given in FIGS. 10A and 10B comprise connection posts 34, but, in some embodiments, no connection posts 34 are formed or provided, and connection posts 34 and component substrate 86 can be omitted, for example to provide first and second components 31, 32 as discussed with respect to FIGS. 9A-9M.

According to some embodiments of the present invention, connection posts 34 are formed on a sacrificial portion 68 of a patterned sacrificial layer 66 of a component source wafer 60 by etching a pyramidal structure into the sacrificial portion 68 and then patterning a conductive metal layer over the etched pyramidal structure. A dielectric component substrate 86 such as silicon oxide or silicon nitride is then deposited over sacrificial portions 68 and the conductive metal layer used to form connection posts 34 (e.g., such that the connection posts 34 are multi-layer comprising a conductive metal outer layer and a dielectric inner layer). Connection posts 34 protrude from a post side 70 of component substrate 86. Vias 82 are formed in a circuit side 72 opposing post side 70 of component substrate 86 over portions of the patterned conductive metal layer forming connection posts 34. LED 81 is disposed on circuit side 72 of component substrate 86, for example by micro-transfer printing LED 81 from a native LED source wafer to component substrate 86. Patterned dielectric structures 87 are formed to insulate edges of LED 81 and expose component contacts 83 on a common side of LED 81 for supplying electrical power to LED 81. LED 81 can include multiple different layers such as conduction layers and emission layers electrically connected to electrical component contacts 83 and can emit light through an emission side of LED 81 opposite the common side or through the common side. As shown in FIG. 10B, micro-transfer printable component 30 can have an encapsulation layer 89 comprising a patterned second dielectric layer to protect component 30 and that can also serve as a tether 62 in addition to or in place of patterned component substrate 86. Thus, tether 62 can have a thickness less than the thickness of the patterned component substrate 86.

Patterned first electrodes 84 (e.g., as shown in FIG. 10B) or patterned second electrodes 85 (e.g., shown in FIG. 10A) can be formed to electrically connect component contacts 83 to connection posts 34 through vias 82. Electrical power supplied through connection posts 34 causes LED 81 to emit light (or, generically, power and/or control signals to travel through component 30). Light can be emitted through component substrate 86 or in a direction opposite to component substrate 86, in which case first and second electrodes 84, 85 do not cover LED 81 common side and a reflective layer can be located on the opposite side. In some embodiments, component contacts 83 are located on a common side of LED 81 adjacent to circuit side 72 of component substrate 86 (not shown). Etching sacrificial portion 68 (formed on or in a surface of component source wafer 60) forms a space or gap beneath component 30 with tethers 62 physically connecting component 30 to an anchor 64 area of component source wafer 60 and releases micro-transfer printable component 30 from component source wafer 60 so that component 30 can be micro-transfer printed, for example to substrate 10.

Forming patterned sacrificial layer 66 and the pyramidal structures, patterning the conductive metal layer to form connection posts 34, depositing component substrate 86, forming vias 82 in component substrate 86, patterning dielectric structures 87, and depositing and patterning first and second electrodes 84, 85 can all be done using photolithographic material deposition and patterning techniques. Sacrificial portion 68 of patterned sacrificial layer 66 can be a designated portion (e.g., a portion that is at least beneath all of a component 30) of an anisotropically etchable material such as silicon <1 0 0>oriented crystalline silicon or a different material. In some embodiments, component substrate 86 can be an oxide layer such as silicon dioxide or a nitride layer such as silicon nitride. First or second electrodes 84, 85 can be made of conventional electrically conductive integrated circuit materials, including aluminum, silver, titanium, copper, or other metals or metal alloys, as can the connection posts 16 and first, second, or third contact pads 12, 13, 14.

According to various embodiments of the present invention, component source wafer 60 can be provided with components 30, patterned sacrificial layer 66 with sacrificial portions 68, tethers 62, anchors 64, and connection posts 34 already formed, or they can be constructed as part of a method in accordance with certain embodiments of the present invention.

Released components 30 can be integrated into a non-native system using micro-transfer-printing. In exemplary methods, a viscoelastic elastomer (e.g., PDMS) stamp (e.g., comprising a plurality of posts) is designed and fabricated to retrieve and transfer arrays of components 30 from their native component source wafer 60 onto non-native application substrates 10. The stamp mounts onto motion-plus-optics machinery that can precisely control the stamp alignment and kinetics. During the printing, the machinery brings the stamp into contact with component source wafer 60, with optical alignment performed before contact. Rapid upward movement of the print-head fractures tether(s) 62, transferring component(s) 30 to the stamp. The populated stamp then transits to destination substrate 10 and first, second, or third components 31, 32, 33 are then aligned to first, second, or third contact pads 12, 13, 14, respectively, and printed.

The spatial distribution of components 30 is a matter of design choice for the end product desired. In some embodiments of the present invention, all components 30 in an array on a component source wafer 60 are transferred to a stamp. In some embodiments, a subset of components 30 in an array on a component source wafer 60 is transferred. By varying the number and arrangement of posts on transfer stamps, the distribution of components 30 on the posts of the transfer stamp can be likewise varied, as can the distribution of components 30 on substrate 10.

Methods of forming micro-transfer printable structures are described further, for example, in the paper *AMOLED Displays using Transfer-Printed Integrated Circuits*. For a discussion of micro-transfer printing techniques see, U.S. Pat. Nos. 8,722,458, 7,622,367 and 8,506,867, each of which is hereby incorporated by reference in its entirety. Micro-transfer printing using compound micro-assembly structures and methods can also be used with the present invention, for example, as described in U.S. patent application Ser. No. 14/822,868, filed Aug. 10, 2015, entitled Compound Micro-Assembly Strategies and Devices, which is hereby also incorporated by reference in its entirety. In some embodiments, component 30 is a compound micro-assembled structure.

Because components 30, in certain embodiments, can be made using integrated circuit photolithographic techniques having a relatively high resolution and cost and substrate 10, for example a printed circuit board, can be made using printed circuit board techniques having a relatively low resolution and cost, first and second contact pads 12, 13 on substrate 10 can be much larger than connection posts 34 or electrical contacts on component 30, thereby reducing manufacturing costs. For example, in certain embodiments, micro-transfer printable component 30 has at least one of a width, length, and height from 2 to 50 μm (e.g., 2 to 5 μm, 5 to 10 μm, 10 to 20 μm, or 20 to 50 μm).

In certain embodiments, substrate 10 is a member selected from the group consisting of polymer, plastic, resin, polyimide, PEN, PET, metal, metal foil, glass, a semiconductor, and sapphire. In certain embodiments, substrate 10 has a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm).

Components 30, in certain embodiments, can be constructed using foundry fabrication processes used in the art. Layers of materials can be used, including materials such as metals, oxides, nitrides and other materials used in the integrated-circuit art. Each component 30 can be or include a complete semiconductor integrated circuit and can include, for example, transistors, diodes, light-emitting diodes, or sensors. Components 30 can have different sizes, for example, 100 square microns or larger, 1000 square microns or larger or 10,000 square microns or larger, 100,000 square microns or larger, or 1 square mm or larger, and can have variable aspect ratios, for example between 1:1 and 10:1 (e.g., 1:1, 2:1, 5:1, or 10:1). Components 30 can be rectangular or can have other shapes.

Component source wafer 60 and components 30, transfer device (e.g., a stamp), and substrate 10 can be made separately and at different times or in different temporal orders or locations and provided in various process states.

Various embodiments of structures and methods were described herein. Structures and methods were variously described as transferring components 30, printing components 30, or micro-transferring components 30. Micro-transfer-printing involves using a transfer device (e.g., an elastomeric stamp, such as a PDMS stamp) to transfer a component 30 using controlled adhesion. For example, an exemplary transfer device can use kinetic or shear assisted control of adhesion between a transfer device and a component 30. It is contemplated that, in certain embodiments, where a method is described as including micro-transfer-printing a component 30, other analogous embodiments exist using a different transfer method. As used herein, transferring a component 30 (e.g., from a source substrate or wafer 60 to a destination substrate 10) can be accomplished using any one or more of a variety of known techniques. For example, in certain embodiments, a pick-and-place method can be used. As another example, in certain embodiments, a flip-chip method can be used (e.g., involving an intermediate, handle substrate). In methods according to certain embodiments, a vacuum tool or other transfer device is used to transfer a component 30.

As is understood by those skilled in the art, the terms "over" and "under" are relative terms and can be interchanged in reference to different orientations of the layers, elements, and substrates included in the present invention. Furthermore, a first layer "on" a second layer is a relative orientation of the first layer to the second layer that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., an in mutual contact).

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific elements, or where processes and methods are described as having, including, or comprising specific steps, it is contemplated that, additionally, there are apparatus, and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 10 substrate
12 first contact pad
12P first portion
13 second contact pad
13P second portion
14 third contact pad
14P third portion
15 solder
16 wire
17 first wire
18 second wire
19 cut first wire
20 first adhesive layer
21 cured first adhesive layer
22 second adhesive layer
23 cured second adhesive layer
24 patterned first adhesive layer
25 cured first patterned adhesive layer
26 patterned second adhesive layer
27 cured patterned second adhesive layer
28 exposed portions of first adhesive layer
29 exposed portions of second adhesive layer
30 component
31 first component
31F faulty first component
32 second component
32F faulty second component
33 third component
34 connection post
60 component source wafer
62 tether
64 anchor
66 patterned sacrificial layer
68 sacrificial portion
70 post side
72 circuit side
81 light-emitting diode (LED)
82 via
83 component contact
84 first electrode
85 second electrode
86 component substrate
87 patterned dielectric
89 encapsulation layer/second dielectric layer
90 test circuit
99 repaired electrical connection structure
100 provide substrate with contact pads step
101 provide substrate with first and second contact pads step
102 provide substrate with first and second contact pads coated with solder step
105 coat solder on contact pads step
110 provide source wafer(s) for components step
111 provide source wafer(s) for first and second components step
120 coat adhesive layer on substrate step
121 coat unpatterned first adhesive layer on substrate step
122 coat patterned first adhesive layer on substrate step
130 micro-transfer print component from source wafer to substrate step
131 micro-transfer print first component from source wafer to substrate step
140 cure adhesive layer step
141 cure first adhesive layer step
150 remove cured adhesive layer from substrate step
151 remove cured first adhesive layer from substrate step
160 test first component step
161 test component step
171 coat unpatterned second adhesive layer on substrate step
172 coat patterned second adhesive layer on substrate step
181 micro-transfer print second component from source wafer to substrate step
191 cure unpatterned second adhesive layer step
192 optional remove cured second adhesive layer from substrate step
194 optional form first electrodes step
195 optional form second electrodes step
196 optional cut wire/destroy component step
197 optional cut first wire step
199 done step

What is claimed:

1. A method of making a repaired electrical connection structure, comprising:
providing a substrate comprising a first contact pad and a second contact pad electrically connected in parallel with the first contact pad;
providing one or more component source wafers comprising a first component and a second component functionally identical to the first component;
disposing a first adhesive layer over and in contact with a first portion of the substrate, wherein the first portion is adjacent to, on, or adjacent to and on the first contact pad;
transferring the first component onto the first adhesive layer so that (i) the first component is in alignment with the first contact pad and (ii) the first adhesive layer contacts a portion of the first component between the first component and the substrate;
curing the first adhesive layer;
testing the first component after curing the first adhesive layer to determine that the first component is a faulty component;
if a second portion of the substrate is covered with the cured first adhesive layer, removing the cured first adhesive layer from the second portion, wherein the second portion is adjacent to, on, or adjacent to and on the second contact pad;
disposing a second adhesive layer over and in contact with the second portion of the substrate, by performing an unpatterned blanket deposition over the substrate and the first component;
transferring the second component onto the second adhesive layer so that (i) the second component is in alignment with the second contact pad and (ii) the second adhesive layer contacts a portion of the second component between the second component and the substrate; and
curing the second adhesive layer after curing the first adhesive layer.

2. The method of claim 1, comprising providing a first wire disposed on, over, or in the substrate and electrically connected to the first contact pad; and cutting the first wire if the first component is a faulty component.

3. The method of claim 1, comprising destroying the first component if the first component is a faulty component.

4. The method of claim 1, wherein the step of disposing the first adhesive layer is an unpatterned blanket deposition over the substrate.

5. The method of claim 1, wherein the step of disposing the first adhesive layer is a patterned deposition over the first contact pad.

6. The method of claim 1, comprising (i) disposing the first component over or laterally adjacent to the first contact pad, (i) disposing the second component over or laterally adjacent to the second contact pad, or (iii) both (i) and (ii).

7. The method of claim 1, wherein (i) the second adhesive layer is thermally cured, (ii) the second adhesive layer is radiation cured, (iii) the first adhesive layer is thermally cured and the second adhesive is radiation cured, or (iv) the first adhesive layer is radiation cured and the second adhesive layer is thermally cured.

8. The method of claim 1, comprising (i) forming a first electrode in electrical contact with the first component and the first contact pad, (ii) forming a second electrode in electrical contact with the second component and the second contact pad, or (iii) both (i) and (ii).

9. The method of claim 1, wherein (i) the first component comprises a first connection post, (ii) the second component comprises a second connection post, or (iii) both (i) and (ii).

10. The method of claim 9, comprising (i) contacting the first connection post to the first contact pad by transferring the first component, (ii) contacting the second connection post to the second contact pad by transferring the second component, or (iii) both (i) and (ii).

11. The method of claim 9, comprising (i) disposing the first connection post above the first contact pad by transferring the first component, (ii) disposing the second connection post above the second contact pad by transferring the second component, or (iii) both (i) and (ii).

12. The method of claim 9, comprising curing the second adhesive layer such that the second connection post is pressed into electrical contact with the second contact pad.

13. The method of claim 9, comprising providing solder disposed on the first contact pad, on the second contact pad, or on both the first and the second contact pads.

14. The method of claim 13, comprising heating the solder to a melting temperature and causing the solder to flow into electrical contact with the first connection post, the second connection post, or both the first and second connection posts, respectively.

15. The method of claim 14, comprising melting the solder before curing the first adhesive layer.

16. The method of claim 14, wherein the first adhesive layer comprises a thermally curable resin that cures at a cure temperature greater than or equal to the melting temperature and comprising the step of curing the first adhesive layer and the step of heating the solder occurring in a common step.

17. The method of claim 14, wherein the first adhesive layer comprises a radiation-curable resin and the step of curing the first adhesive layer comprises curing with radiation at a temperature greater than or equal to the melting temperature.

18. The method of claim 1, wherein the one or more component source wafers comprises a third component functionally identical to the first and second components and the method comprises:
providing a substrate comprising a third contact pad electrically connected in parallel with the first contact pad and with the second contact pad;
testing the second component to determine that the second component is a faulty component;
if a third portion of the substrate is covered with the cured first adhesive layer or the cured second adhesive layer, removing the cured first adhesive or the cured second adhesive layer from the third portion, wherein the third portion is adjacent to, on, or adjacent to and on the third contact pad;
disposing a third adhesive layer over and in contact with a third portion of the substrate, wherein the third portion is adjacent to, on, or adjacent to and on the third contact pad, and
transferring the third component onto the third adhesive layer so that (i) the third component is in alignment with the third contact pad and (ii) the third adhesive layer contacts a portion of the third component between the third component and the substrate, and
curing the third adhesive layer.

19. The method of claim 1, wherein the step of transferring the second component onto the second adhesive layer comprises micro-transfer printing the second component.

20. The method of claim 1, wherein the first adhesive layer comprises a first material and the second adhesive layer comprises a second material different than the first material.

21. The method of claim 1, wherein the first adhesive layer is cured at a first temperature and the second adhesive layer is cured at a second temperature different from the first temperature.

22. The method of claim 1, wherein the first temperature is greater than the second temperature.

\* \* \* \* \*